(12) United States Patent
Campbell et al.

(10) Patent No.: US 7,321,234 B2
(45) Date of Patent: Jan. 22, 2008

(54) RESISTIVE TEST PROBE TIPS AND APPLICATIONS THEREFOR

(75) Inventors: Julie A. Campbell, Beaverton, OR (US); Lawrence W. Jacobs, Beaverton, OR (US)

(73) Assignee: LeCroy Corporation, Chesnut Ridge, NY (US)

( * ) Notice: Subject to any disclaimer, the term of this patent is extended or adjusted under 35 U.S.C. 154(b) by 0 days.

(21) Appl. No.: 11/725,736

(22) Filed: Mar. 19, 2007

(65) Prior Publication Data

US 2007/0229099 A1    Oct. 4, 2007

Related U.S. Application Data

(63) Continuation-in-part of application No. 11/018,133, filed on Dec. 17, 2004, now Pat. No. 7,202,678, application No. 11/725,736, which is a continuation-in-part of application No. 11/352,128, filed on Feb. 10, 2006, now Pat. No. 7,262,614.

(60) Provisional application No. 60/652,046, filed on Feb. 10, 2005, provisional application No. 60/531,076, filed on Dec. 18, 2003.

(51) Int. Cl.
  *G01R 31/02* (2006.01)
(52) U.S. Cl. ....................... 324/754
(58) Field of Classification Search ............... 324/754
See application file for complete search history.

(56) References Cited

U.S. PATENT DOCUMENTS 3,992,073 A    11/1976   Buchoff et al.
4,189,203 A    2/1980    Miller
4,450,314 A    5/1984    Huther
4,491,788 A    1/1985    Zandonatti
4,552,465 A    11/1985   Anderson
4,923,407 A    5/1990    Rice et al.
5,139,862 A    8/1992    Swift et al.
5,177,439 A *  1/1993    Liu et al. ................... 324/754

(Continued)

FOREIGN PATENT DOCUMENTS

CH    000667945 A    11/1988

(Continued)

OTHER PUBLICATIONS

Thomas Aisenbrey, "Low-Cost Antennas Using Conductive Plastics," U.S. Appl. No. 60/268,822, filed Feb. 15, 2001, 4 pages, U.S. Patent and Trademark Office, U.S.

(Continued)

*Primary Examiner*—Ha Tran Nguyen
*Assistant Examiner*—Richard Isla-Rodas
(74) *Attorney, Agent, or Firm*—Law Office of Karen Dana Oster, LLC

(57) ABSTRACT

A test probe tip constructed substantially from resistive material. The resistive material is made of resistive conducting material substantially enclosed in and dispersed throughout encapsulating material. The test probe tip has a probing end for probing electronic circuitry and a connection end for interfacing with a probing head. The resistive conducting material forms at least one path through the encapsulating material from the probing end to the connection end. The resistive conducting material may be a plurality of longitudinally-extending resistive/conductive members or a plurality of particulate resistive/conductive members.

18 Claims, 19 Drawing Sheets

U.S. PATENT DOCUMENTS

| | | | |
|---|---|---|---|
| 5,291,129 | A | 3/1994 | Kazama |
| 5,508,627 | A | 4/1996 | Patterson |
| 5,530,375 | A | 6/1996 | Seidel |
| 5,606,263 | A | 2/1997 | Yoshizawa et al. |
| 5,701,666 | A | 12/1997 | DeHaven et al. |
| 5,864,946 | A | 2/1999 | Eldridge et al. |
| 5,914,612 | A | 6/1999 | Koken et al. |
| 5,939,890 | A | 8/1999 | Kohen et al. |
| 6,137,287 | A * | 10/2000 | Ichihashi ............... 324/160 |
| 6,214,921 | B1 | 4/2001 | Bluett et al. |
| 6,276,956 | B1 | 8/2001 | Cook |
| 6,529,024 | B2 | 3/2003 | Noda |
| 6,535,003 | B2 | 3/2003 | Aldaz et al. |
| 6,652,326 | B2 | 11/2003 | Boyle et al. |
| 6,741,221 | B2 | 5/2004 | Aisenbrey |
| 6,828,768 | B2 | 12/2004 | McTigue |
| 6,870,516 | B2 | 3/2005 | Aisenbrey |
| 6,940,209 | B2 | 9/2005 | Henderson |
| 6,967,473 | B1 | 11/2005 | Reed et al. |
| 6,992,496 | B2 | 1/2006 | Winter et al. |
| 7,006,046 | B2 | 2/2006 | Aisenbrey |
| 7,141,999 | B2 | 11/2006 | Park et al. |
| 7,170,214 | B2 | 1/2007 | Henderson et al. |
| 7,183,781 | B2 | 2/2007 | LaMeres et al. |
| 7,202,678 | B2 | 4/2007 | Campbell et al. |
| 2004/0066181 | A1 | 4/2004 | Thies |
| 2005/0253618 | A1* | 11/2005 | Howland et al. ............ 324/765 |
| 2005/0280433 | A1 | 12/2005 | Nelson et al. |
| 2006/0028216 | A1* | 2/2006 | Murase ............... 324/724 |
| 2006/0119522 | A1 | 6/2006 | Aisenbrey |
| 2006/0119523 | A1 | 6/2006 | Aisenbrey |
| 2006/0267604 | A1 | 11/2006 | Yang |
| 2006/0267606 | A1 | 11/2006 | Groshong et al. |
| 2007/0051169 | A1 | 3/2007 | Jung et al. |

FOREIGN PATENT DOCUMENTS

| | | |
|---|---|---|
| JP | 10-282140 | 10/1998 |
| JP | 11-258270 | 9/1999 |
| WO | WO03/096409 | 11/2003 |

OTHER PUBLICATIONS

Thomas Aisenbrey, "Low-Cost Antennas Using Conductive Plastics," U.S. Appl. No. 60/269,414, filed Feb. 16, 2001, 8 pages, U.S. Patent and Trademark Office, U.S.

Thomas Aisenbrey, "Low Cost Antennas Implemented With Composites of Conductive Powders, Fibers, or Concentrates," U.S. Appl. No. 60/317,808, filed Sep. 7, 2001, 10 pages, U.S. Patent and Trademark Office, U.S. cited by other.

Thomas Aisenbrey, "Low Cost Electronic Probe Using Conductive Plastics or Conductive Composites," U.S. Appl. No. 60/478,776, filed Jun. 16, 2003, 15 pages, U.S. Patent and Trademark Office, U.S.

"Stat-Kon DCL-4413 SM Data Sheet," LNP Engineering Plastics Inc., at least as early as Jun. 8, 2005, 2 pages.

"Stat-Kon EC-1005 Data Sheet," LNP Engineering Plastics Inc., at least as early as Jun. 8, 2005, 2 pages.

"Stat-Kon EC-1005 SM Data Sheet," LNP Engineering Plastics Inc., at least as early as Jun. 8, 2005, 2 pages.

"Electrafil: General Information on Application and Properties," DSM Engineering Plastics Inc., at least as early as Aug. 24, 2006. 15 pages.

"Tektronix: Surface Mount Device Interconnects," Tektronix, at least as early as Feb. 9, 2006, 5 pages, http://www.tek.com/site/ps/0,,60-10008-INTRO_EN,00.html.

"LeCroy WaveLink Probe System: Unprecedented Flexibility for Probe Interconnection," LeCroy Corporation, at least as early as Sep. 2005, pp. 1-8, http://www.lecroy.com/tm/products/Probes/Differential/WaveLink/WaveLink_DC_high.pdf.

"WaveLink Differential Probe," LeCroy Corporation, filed May 2005, pp. 4-19, http://www.lecroy.com/tm/library/manuals/WaveLink/InstructionManual/WL_OM_REVC.pdf.

* cited by examiner

FIG. 12
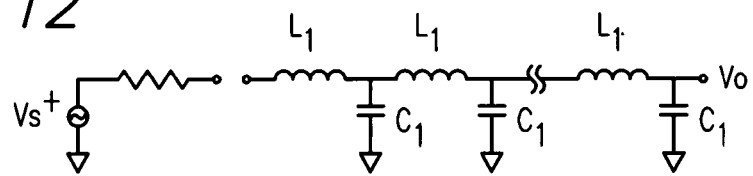
FIG. 13
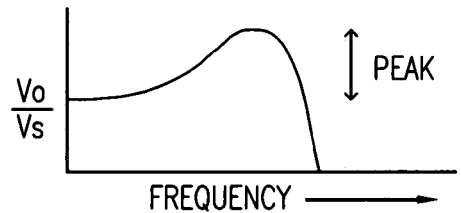
FIG. 14
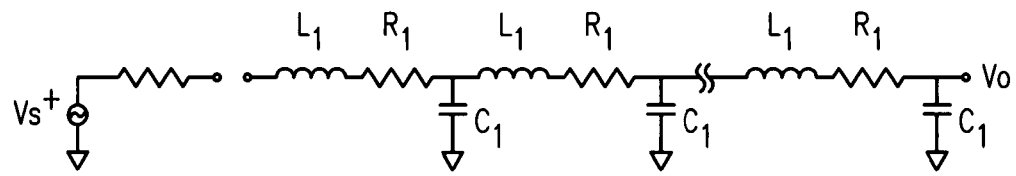
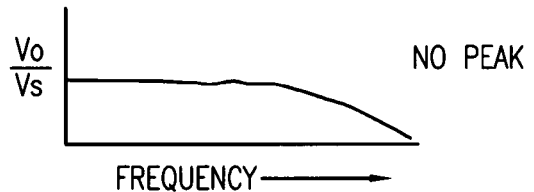
FIG. 15

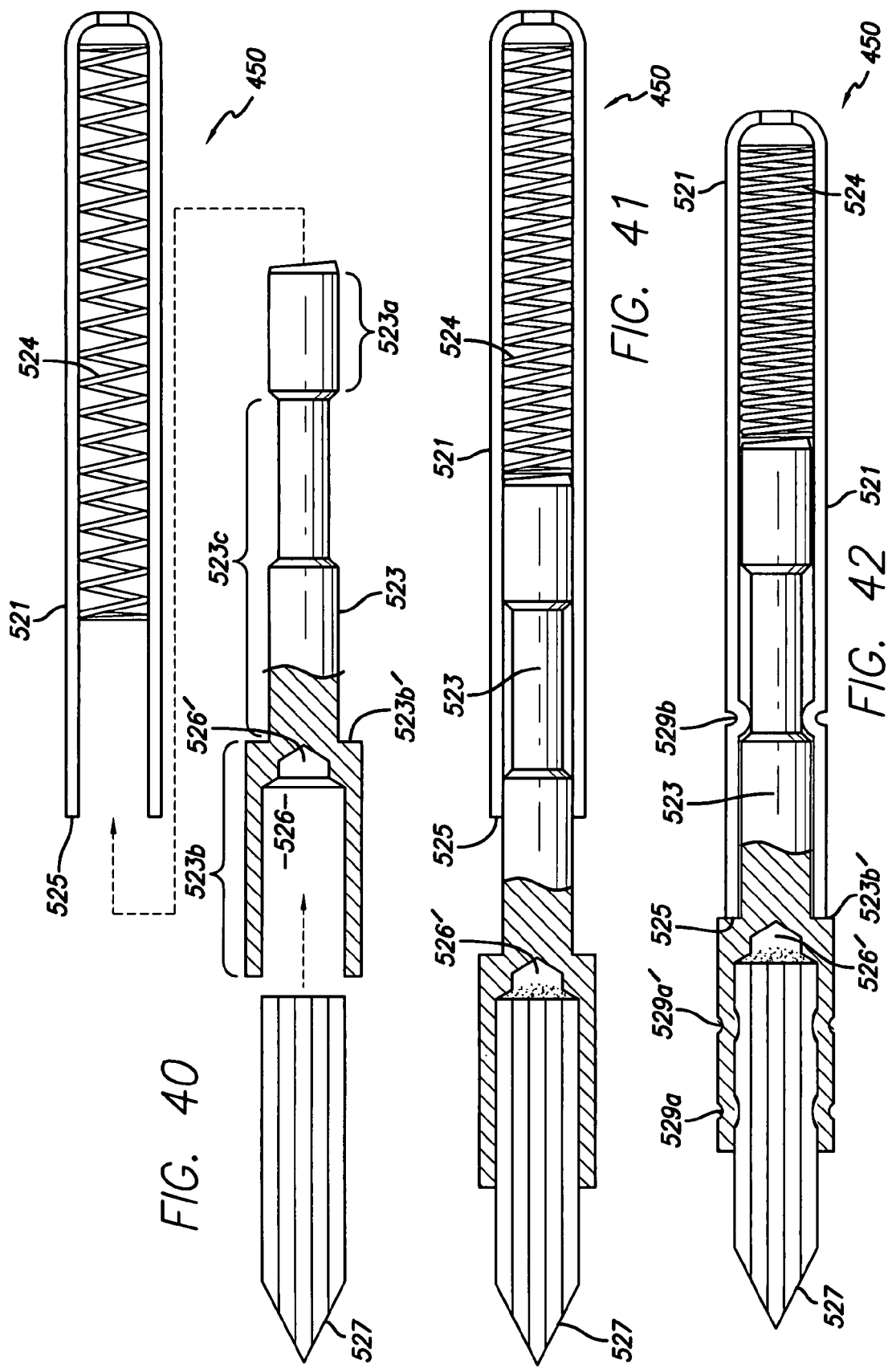

RESISTIVE TEST PROBE TIPS AND APPLICATIONS THEREFOR

The present application is a continuation-in-part of U.S. patent application Ser. No. 11/018,133, filed Dec. 17, 2004, now U.S. Pat. No. 7,202,678. U.S. patent application Ser. No. 11/018,133 claims the benefit under 35 USC Section 119(e) of U.S. Provisional Patent Application Ser. No. 60/531,076 filed Dec. 18, 2003. The present application is a continuation-in-part of U.S. patent application Ser. No. 11/352,128, filed Feb. 10, 2006, now U.S. U.S. Pat. No. 7,262,614. U.S. patent application Ser. No. 11/352,128 claims the benefit under 35 USC Section 119(e) of U.S. Provisional Patent Application Ser. No. 60/652,046, filed Feb. 10, 2005. The present application is based on and claims priority from these applications, the disclosures of which are hereby expressly incorporated herein by reference in their entirety.

BACKGROUND OF INVENTION

The present invention is directed to electrical test probe tips and, more particularly to resistive test probe tips and applications therefor.

Electrical signals are the blood that flows through electrical components. Connection mechanisms such as wires, traces, leads, legs, pins, vias, or other connection mechanisms act as the veins and arteries through which the signal blood flows.

Electrical test probes are used to provide an electrical connection between electrical components and testing instruments such as oscilloscopes and other measuring, monitoring, diagnostic, and signal processing instruments. A differential test probe measures two signals and outputs a third signal representing the difference between the first signal and the second signal. As the size of electrical components decreases, probing heads, probing tips, and/or test probe tips get smaller.

An electrical test probe generally consists of a probing head, a cable, and a testing instrument connector. The probing head may have an integral or replaceable electrical test probe tip that is suitable for making an electrical contact with electrical components. The testing instrument connector is suitable for connecting to a testing instrument. The probing head is attached to a first end of the cable and the testing instrument connector is attached to the opposite end of the cable. The probing head circuitry represented in FIGS. 2, 3, and 6 are meant to be broad generalizations of probing heads. It is recognized that probing heads in general may have some parasitic capacitance and inductance.

A perfect test probe tip would have a frequency response in which the voltage in was equal to the voltage out. As shown in FIG. 1, this frequency response would be perfectly flat, like trace A.

Traditional test probe tips 30 are generally a single piece of metal that may or may not have a shaped probing end or point of contact 32. The form (e.g. the pointed tip) and strength of these traditional test probe tips 30 make them extremely useful for probing electrical components. As shown in FIG. 2, these traditional test probe tips 30 have some inherent inductance 34 and at least some stray capacitance 36 between the point of contact 32 and ground 38. A traditional metal test probe tip has a frequency response such as trace B (FIG. 1). This frequency response tends to have a relatively high peak, but then falls off sharply.

The evolution of electronic circuitry and higher bandwidth signals necessitated new test probe tips with frequency responses closer to the perfect frequency response. As shown in FIG. 3, to counteract the resonance between the inductance 34 of the test probe tip 30 and the stray capacitance 36, it has been known to add a resistor 40 (which may have leads) just before the point of contact 32. A test probe tip with an added resistor has a frequency response such as trace C (FIG. 1). This frequency response does not have the relatively high initial peak associated with traditional metal test probe tips. Adding the resistor 40 and leads (leaded resistor 40) is problematic because it adds unwanted length to the test probe tip 30. In use, this type of test probe tip usually must be soldered into place, as its leads are too soft for a browsing (quick touch) type of probing of electrical components. To use this type of test probe tip for quick touch browsing, the test probe tip would have to have reinforcement that would add parasitic capacitance.

When a capacitor (or low pass filter) is added between differential test probe tips or a capacitor is added between the single-ended test probe tip and ground, the effect is to "roll off" the frequency response. As shown in trace D of FIG. 1, although this would bring down the peak of the frequency response, it would also reduce the bandwidth performance of the test probe tip.

Extrusion and pultrusion are manufacturing methods. Using extrusion, material (e.g. plastic, composites, resins, or metals) is pressurized and forced (pushed) through an opening of a particular shape. Using extrusion, the finished product will be larger than the die opening due to the pressure flowing through the die. Using pultrusion, material is "pulled" or drawn through an opening of a particular shape. Using pultrusion, the finished product will be smaller than the die opening due to the pulling (stretching) of the material. Pultruded products tend to be stronger than extruded products. As an example of pultrusion, fibers (e.g. fiberglass) may be impregnated with liquid resin, carefully formed, and pulled through a heated die by powerful equipment. A fully cured and solid composite profile exits the die. The resulting product may be cut, shaped, and/or machined.

As a manufacturing process, pultrusion has many advantages including ease of automation and cost-effectiveness. Pultruded products also have many advantages. For example, all pultruded profiles have continuous cross-section, but they can have a variety of shapes, sizes, colors, fabrication options, and protective finishes. Pultruded products can be tailored to provide high performance and cost advantages over materials such as metals, wood, and extruded thermoplastics. As compared to metals, pultruded composites offer weight reduction, thermal insulation, superior corrosion and chemical resistance, greater strength, and reduced expansion and contraction with temperature (CTE).

U.S. Pat. No. 5,139,862 to Swift et al. (the "Swift reference"), the disclosure of which is incorporated herein by reference, is directed to an electronic device for conducting electric current that has two contacting components at least one of which is a nonmetallic electronic contact in the form of a pultruded composite member made of a plurality of small generally circular cross-section conductive fibers in a polymer matrix. The fibers are oriented in the matrix in a direction substantially parallel to the axial direction of the pultruded composite member and are continuous from one end of the member to the other to provide a plurality of electrical contact points at each end of the member.

BRIEF SUMMARY OF THE INVENTION

The present invention is directed to a test probe tip constructed substantially from resistive material. The resistive material is made of resistive conducting material substantially enclosed in and dispersed throughout encapsulating material. The test probe tip has a probing end for probing electronic circuitry and a connection end for interfacing with a probing head. The resistive conducting material forms at least one path through the encapsulating material from the probing end to the connection end. The resistive conducting material may be a plurality of longitudinally-extending resistive/conductive members or a plurality of particulate resistive/conductive members.

A test probe tip of the present invention has substantially flat frequency response without a loss of bandwidth. Further, test probe tips made from the resistive material may be used as "touch and browse" test probe tips.

One application in which a test probe tip constructed substantially from resistive material may be used is a substantially planar probing tip. A substantially planar (in an x-y plane) probing tip includes a probing tip body, a first test point connector projection, and a second test point connector projection. The first test point connector projection is movably attached to the planar probing tip body to allow motion therebetween. The second test point connector projection is also attached to the planar probing tip body. A test probe tip (alone or as part of a test point connector) may be connected to each test point connector projection. The motion actuator actuates motion that the motion translator, in turn, converts to move at least one of the test point connector projection connection ends in a third dimension out of the x-y plane. The probing tip has an open position in which the relative distance between the first test point connector projection and the second test point connector projection is relatively large. The probing tip also has a closed position in which the relative distance between the first test point connector projection and the second test point connector projection is relatively small. In one alternative preferred embodiment, the second test point connector projection body end is also movably attached to the planar probing tip body to allow motion therebetween. In one alternative preferred embodiment, the motion actuator actuates motion in a first linear direction and the motion translator converts the first linear direction into motion of at least one of the test point connector projection connection ends in a second linear direction. In one alternative preferred embodiment, the motion actuator converts torque into linear force.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 12 is a circuit diagram of a prior art traditional metal test probe tip modeled as a distributed circuit or transmission line with inductance and capacitance per unit length.

FIG. 13 is a frequency response chart of the circuit shown in FIG. 12.

FIG. 14 is a circuit diagram of a test probe tip made of resistive material.

FIG. 15 is a frequency response chart of the circuit shown in FIG. 14.

FIG. 40 is an expanded cross-sectional view of an alternative spring-loaded pogo pin test point connector including a sleeve, a plunger, and a resistive test probe tip.

FIG. 41 is a cross-sectional view of the alternative spring-loaded pogo pin test point connector in which the resistive test probe tip is positioned in the plunger, and the plunger is positioned in the sleeve, the pogo pin test point connector in an expanded state.

FIG. 42 is a cross-sectional view of the alternative spring-loaded pogo pin test point connector in which the resistive test probe tip is secured in the plunger, and the plunger is secured in the sleeve, the pogo pin test point connector in a contracted state.

DETAILED DESCRIPTION OF THE INVENTION

Figure 1:
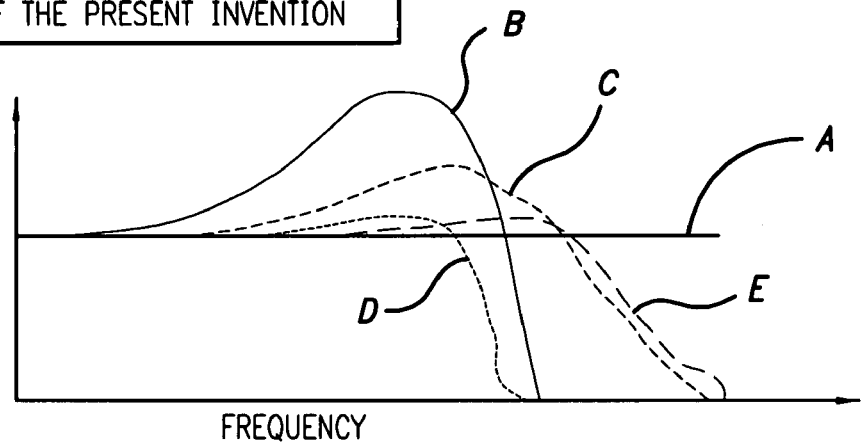
FIG. 1 is a frequency response chart showing the difference in frequency responses of a perfect test probe tip (A), a traditional test probe tip (B), a test probe tip with added resistor(s) (C), a test probe tip with added capacitor(s) (D), and the test probe tip of the present invention (E).
Figure 2:
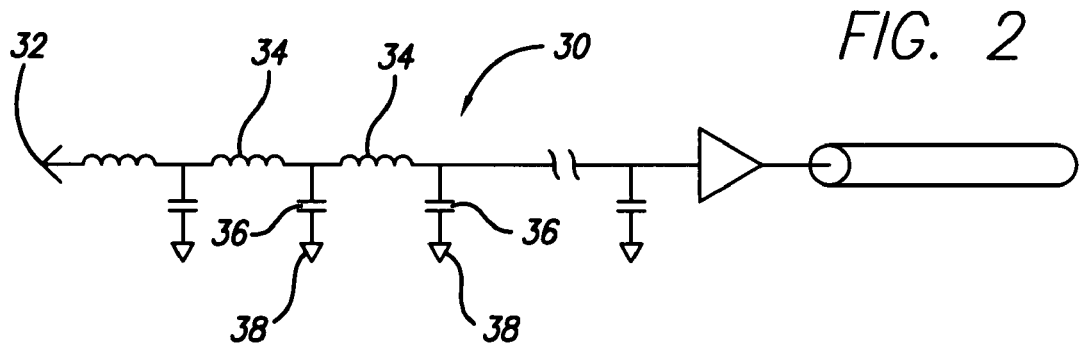
FIG. 2 is a circuit diagram of a prior art traditional metal test probe tip.
Figure 3:
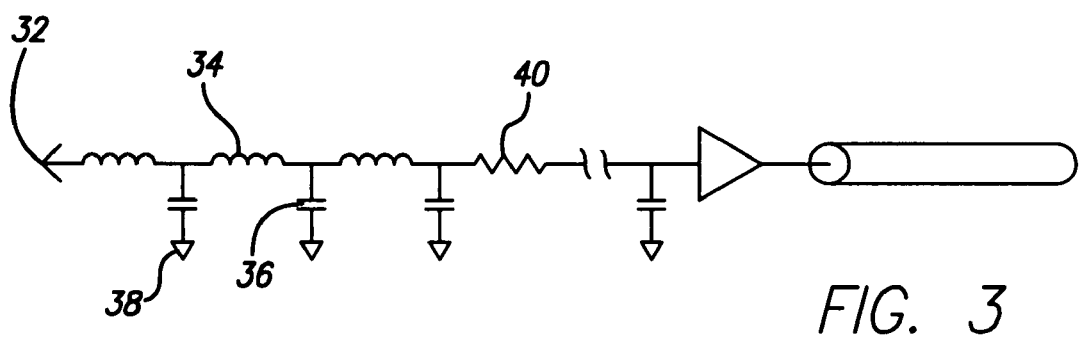
FIG. 3 is a circuit diagram of a prior art test probe tip having an added resistor just before the point of contact.

The present invention is a resistive test probe tip in which the entire test probe tip (or substantially the entire probe tip) is a resistor. In one preferred embodiment, the test probe tip is made from resistive material. As can be seen in FIG. 1, the present invention has a frequency response such as trace E that is a significant improvement over the frequency response (trace B) of a traditional metal test probe tip (FIG. 2) and over frequency responses (trace D) of test probe tips with at least one added capacitor. The frequency response (trace E) of the present invention is similar (and preferably slightly improved) to frequency responses (trace C) of test probe tips with at least one added resistor (FIG. 3). Because the entire extension is resistive, the resistive test probe tip of the present invention may be a long probe tip without the problems associated with length and the increased inductance usually associated with length. In addition, because of the strength of the resistive test probe tips of the present invention, they may still be useful as "touch and browse" test probe tips. For example, a resistive test probe tip of the present invention may be used in planar probing tips such as those discussed below as applications of the present invention. The resistive test probe tip may be a test point connector itself, or may be incorporated into a test probe connector such as a spring-loaded pogo pin test point connector.

The present invention can be seen as a dramatic step forward in the evolution of testing probes. Although prior art test probe tips such as those shown in FIG. 3 recognized the advantages of resistance, traditional material that would be thought of as resistive (e.g. carbon, nichrome, graphite) is brittle and would not be useable for probing. It would also be difficult or impossible to form these traditional materials into specific probe tip shapes. It is only with the relatively new development of resistive composite materials that the present invention could have been made.

Figure 4:
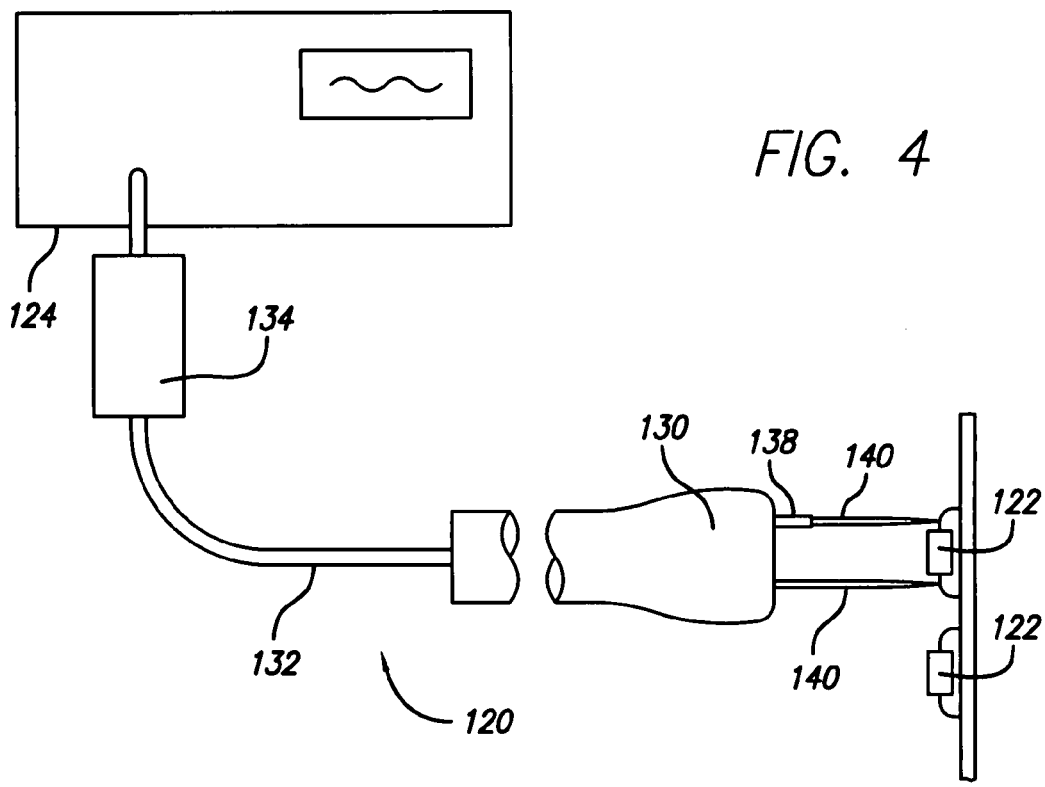
FIGS. 4 and 5 are schematic diagrams of exemplary probing systems in use.
Figure 5:
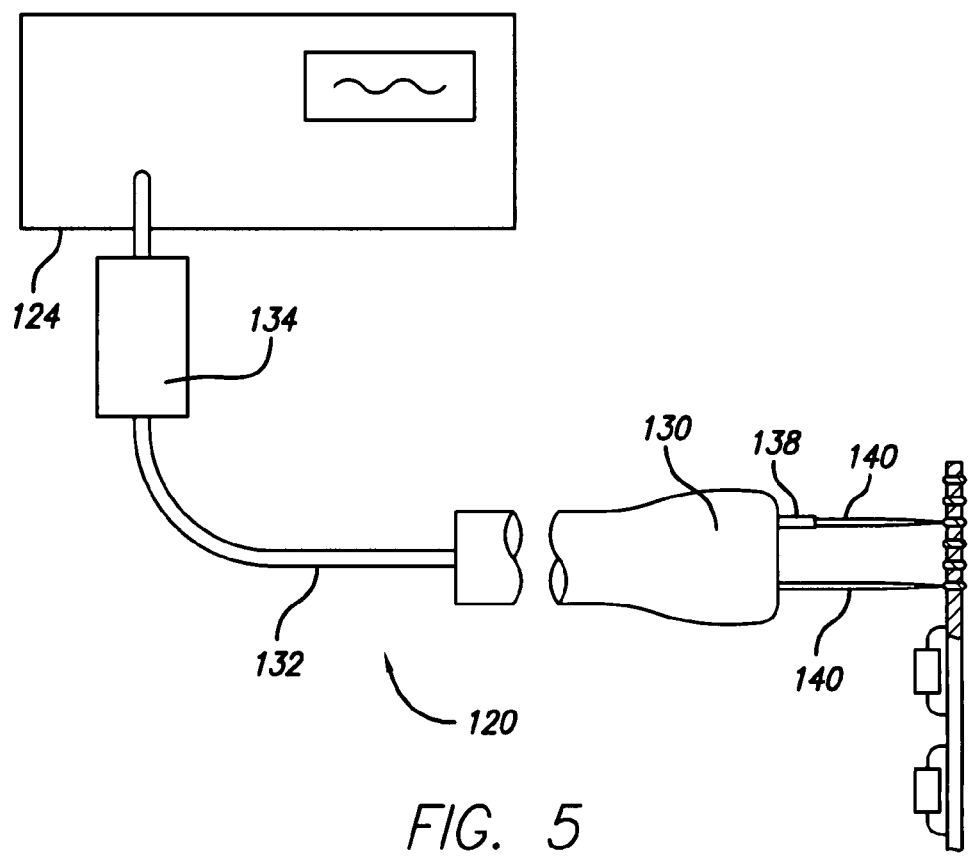

As shown in FIGS. 4 and 5, the present invention may be implemented as part of a probing system that includes an electrical test probe 120 for providing an electrical connection between electrical components 122 and testing instruments 124. An electrical test probe 120 generally consists of a probing head 130, a cable 132, and a testing instrument connector 134. The probing head 130 may have an integral or replaceable test probe tip 140 that is suitable for making electrical contact with electrical components 122. The testing instrument connector 134 is suitable for connecting to a testing instrument 124. If the test probe tip 140 is replaceable, generally the probing head 130 will have a socket 138 or other connection mechanism for mating with the test probe tip 140. In one alternative embodiment, the probe tip may be conductively glued or soldered to the transmission path of the probing head 130. The probing head 130 is attached to a first end of the cable 132 and the testing instrument connector 134 is attached to the opposite end of the cable 132.

Figure 6:
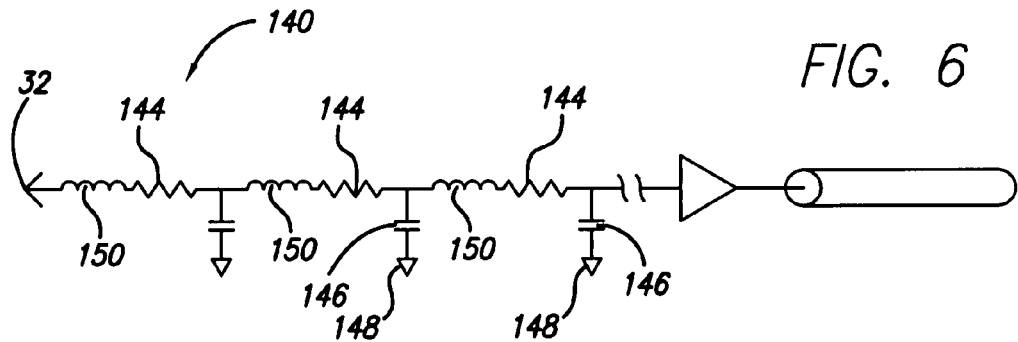
FIG. 6 is a circuit diagram of a test probe tip of an exemplary embodiment of the present invention.
Figure 11:
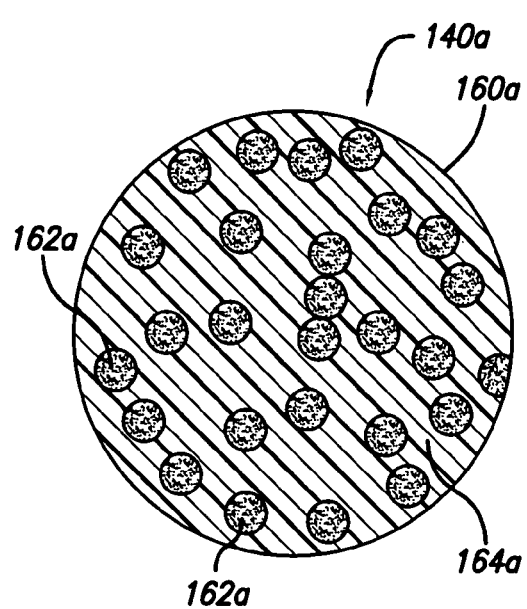
FIG. 11 is a cross-sectional view of the resistive test probe tip of FIG. 7 taken along line 11'-11'.

FIGS. 6-11 show different views of exemplary embodiments of the test probe tip 140 of the present invention. FIG. 6 shows an exemplary circuit diagram of the test probe tip 140. FIGS. 7-10 show exemplary longitudinal cross-sectional views of alternative embodiments of the present invention. FIG. 11 shows an exemplary cross-sectional view of the embodiment shown in FIG. 7.

This test probe tip 140 is constructed substantially of resistive material that preferably has a shaped probing end or point of contact 142. As with traditional probe tips, the test probe tip 140 has some inherent inductance 144 and at least some stray capacitance 146 between the point of contact 142 and ground 148. However, the resistive material 160 (shown also as resistive material 160a, 160b, and/or 160c), from which the test probe tip 140 (shown also as test probe tip 140a, 140b, and/or 140c) of the present invention is constructed, has inherent resistance 150 that counteracts the resonance between the inductance 144 of the test probe tip 140 and the stray capacitance 146. This can be done without adding length to the test probe tip 140 because the test probe tip 140 of the present invention has resistive characteristics.

FIGS. 7-11 show exemplary mechanical embodiments of the resistive test probe tip 140a (FIG. 7), 140b (FIG. 8), or 140c (FIG. 9) (that will be discussed generally as test probe tip 140) of the present invention. Each of these embodiments is made of resistive material 160a (FIG. 7), 160b (FIG. 8), or 160c (FIG. 9) (that will be discussed collectively as resistive material 160). The resistive material includes at least one resistive/conductive member 162a (FIG. 7), 162b (FIG. 8), or 162c (FIG. 9) (that will be discussed collectively as resistive/conductive member 162) that is surrounded by encapsulating material 164a (FIG. 7), 164b (FIG. 8), or 164c (FIG. 9) (that will be discussed generally as encapsulating material 164). The resistive material 160, for purposes of this invention, includes at least one resistive/conductive member 162 substantially enclosed in encapsulating material 164. It should be noted that, in at least one preferred embodiment, the encapsulating material 164 is nonconductive. The exemplary probe tips 140 preferably have a longitudinal axis 152, a probing end 154a for probing electronic circuitry 122, and a connection end 154b for interfacing with a probing head 130.

Figure 7:
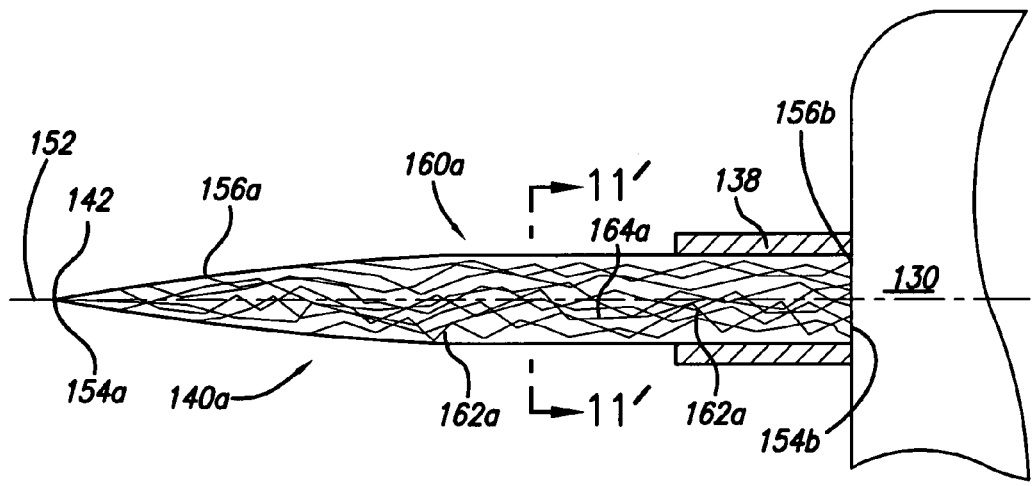
FIG. 7 is a cross-sectional top view of a first exemplary resistive test probe tip of the present invention in a connection mechanism of a probing head, the resistive test probe tip having longitudinal resistive/conductive members dispersed unevenly within encapsulating material.
Figure 8:
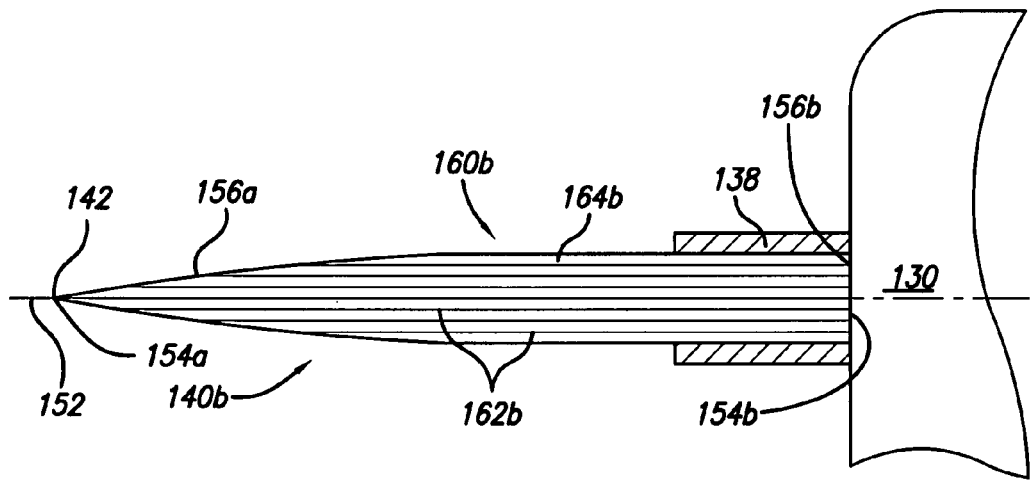
FIG. 8 is a cross-sectional top view of a second exemplary resistive test probe tip of the present invention in a connection mechanism of a probing head, the resistive test probe tip having longitudinal resistive/conductive members dispersed evenly within encapsulating material.

FIGS. 7 and 8 show exemplary embodiments of the resistive test probe tip 140a (FIG. 7) and 140b (FIG. 8) of the present invention in which the resistive material 160a, 160b has a plurality of longitudinally-extending resistive/conductive members (resistive conducting material) 162a, 162b surrounded by encapsulating material 164a, 164b. In FIG. 7, the longitudinally-extending resistive/conductive members 162a are dispersed unevenly within the encapsulating material 164a. In FIG. 8, the longitudinally-extending resistive/conductive members 162b are dispersed evenly within the encapsulating material 164b. In these embodiments, the resistive material 160 may be, for example, pultruded rod (e.g. Carbon X produced by Xerox Corporation). In one preferred embodiment, the resistive material 160 is formed using a pultrusion method such as those described in the Swift reference. The Swift reference also describes exemplary materials that could be used to implement the present invention. Each longitudinally-extending resistive/conductive member has a first resistive/conductive member end 156a and a second resistive/conductive member end 156b. The first resistive/conductive member end 156a is at the probing end 154a and the second resistive/conductive member end 156b is at the connection end 154b.

In FIGS. 7 and 8, the at least one longitudinally-extending resistive/conductive member 162 may be resistive/conductive fiber elements. Preferably the at least one longitudinally-extending resistive/conductive member 162 is hundreds or thousands of resistive/conductive fiber elements with ends exposed so as to provide electronic contacts at both ends of each resistive/conductive fiber element. The fiber loading in the encapsulating material 164 depends upon the conductivity desired and the cross-sectional area of the resistive material 160. To increase the conductivity, additional resistive/conductive fiber may be added. A high degree of redundancy and availability of electrical contact points enables a substantial improvement in reliability. Since the plurality of resistive/conductive members 162 are pulled as a continuous length, the resulting resistive material 160 is formed with the resistive/conductive members 162 being continuous from one end of the resistive material 160 to the other and oriented within the encapsulating material 164 in a direction substantially parallel to the axial direction of the member. The term "axial direction" is intended to be construed as in a substantially lengthwise or longitudinal direction or along the major axis. Accordingly, the resistive material 160 may be formed in a continuous length and cut to any suitable dimension providing at each end a very large number of electrical contact points, the electrical contact points being the ends of each of the individual resistive/conductive members 162.

Figure 9:
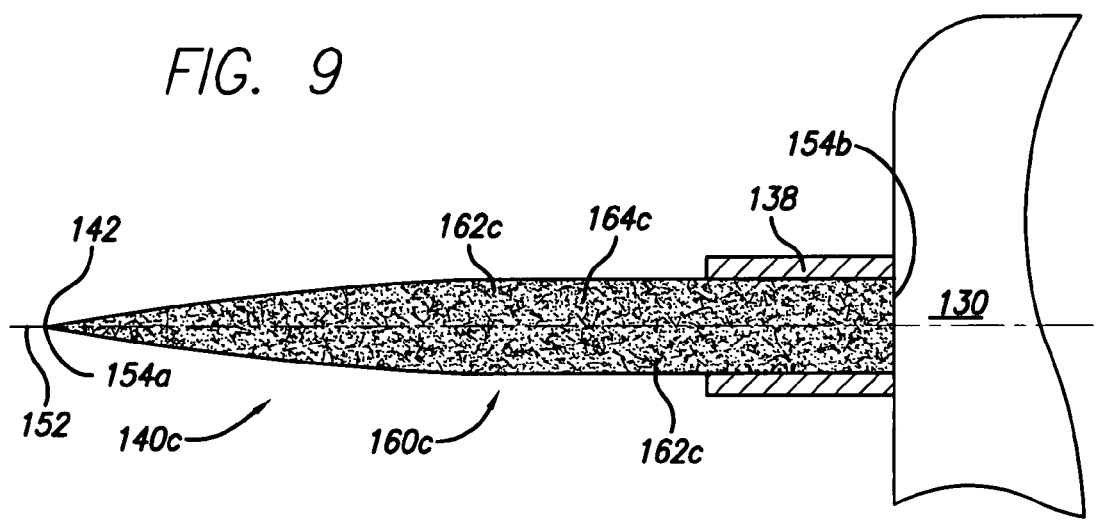
FIG. 9 is a cross-sectional top view of a third exemplary resistive test probe tip of the present invention in a connection mechanism of a probing head, the resistive test probe tip having particulate resistive/conductive members dispersed within encapsulating material.
Figure 10:
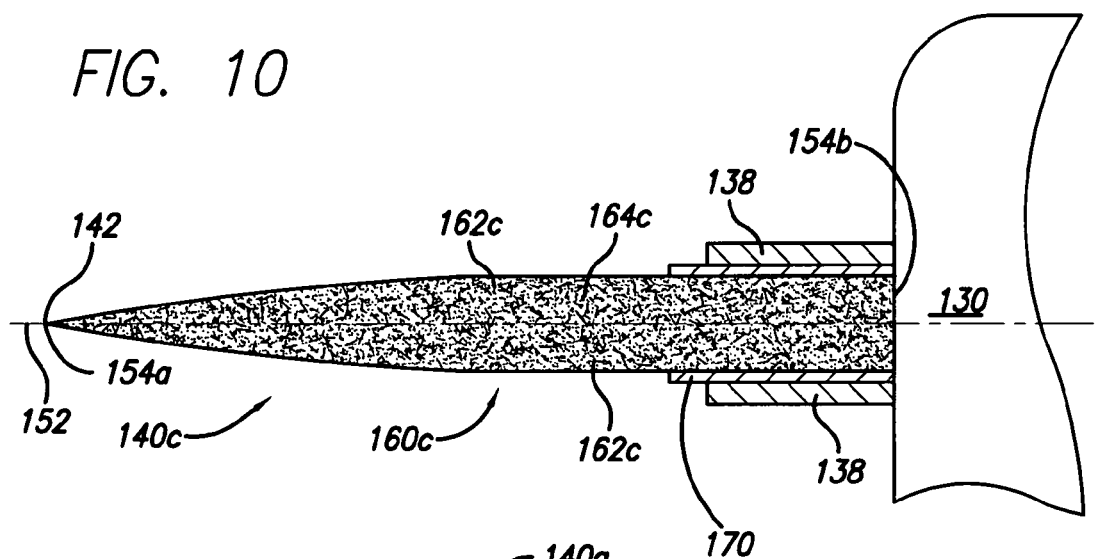
FIG. 10 is a cross-sectional top view of the resistive test probe tip of FIG. 9 that is at least partially coated.

FIG. 9 shows an alternative exemplary embodiment of the resistive test probe tip 140c of the present invention in which the resistive material 160c has a plurality of resistive/conductive members 162c (resistive conducting material) surrounded by encapsulating material 164c. In this embodiment, the resistive/conductive members 162c are particulate resistive/conductive members dispersed within encapsulating material. There should be sufficient resistive/conductive members 162c to form at least one path through the encapsulating material 164c from the probing end 154a to the connection end 154b. It should be noted that one alternative method that may be used to create the test probe tip 140c is an injection molding process in which the encapsulating material 164c is impregnated with resistive/conductive members 162c (e.g. carbon dust). Recent advances in mini molding and laser forming make this process possible.

It should be noted that a probe tip of the present invention may be at least partially enclosed in a protective sleeve 170. For example, in FIG. 10 the probe tip is partially surrounded by a coated or plated sleeve 170. The sleeve 170 preferably has a low resistance. In one preferred embodiment, the sleeve 170 may be laser trimmed.

Any suitable resistive/conductive members 162 may be used in the practice of the present invention. Typically, the resistive/conductive members 162 are resistive/conductive fibers (e.g. carbon, carbon/graphite, nichrome, graphite) that may be nonmetallic and have a DC volume resistivity suitable for their intended purposes. Particularly preferred resistive/conductive members 162 that may be used are those resistive/conductive members 162 that are obtained from the controlled heat treatment processing to yield partial carbonization of the polyacrylonitrile (PAN) precursor fibers. The term "nonmetallic" is used to distinguish from conventional metal fibers that exhibit metallic conductivity having resistivities of the order of $1 \times 10^{-6}$ $\Omega$/cm and to define a class of fibers that are nonmetallic but can be treated in ways to approach or provide metal-like properties. Higher resistivity materials may be used if the impedance of an associated electronic circuit is sufficiently high.

Any suitable encapsulating material 164 may be employed in the practice of the present invention. The encapsulating material 164 may be insulating or conducting. If cross-directional electrical connection is desired along the edges of the pultrusion, a conducting polymer may be used. Conversely, if insulating properties are desired along the edges of the pultrusion, an insulating encapsulating material 164 may be used, or insulating fibers can be used in the outer periphery of the pultruded configuration and the conducting fibers can be configured to reside away from the edges. Typically, the encapsulating material 164 may be, for example, a polymer selected from the group of structural thermoplastic and thermosetting resins. Polyesters, epoxies, vinyl esters, polyetheretherketone, polyetherimides, polyethersulphones, polypropylene, and nylon are, in general, suitable materials with the polyesters being preferred due to their short cure time and relative chemical inertness. If an elastomeric matrix is desired, a silicone, fluorosilicone, or polyurethane elastomer may provide the polymer matrix.

FIGS. 12-15 will be used to explain one preferred method of determining the proper length of the test probe tip 140 of the present invention. First, as shown in FIG. 12, a metal probe tip can be modeled as a distributed circuit or transmission line with inductance and capacitance per unit length. The frequency response of the circuit shown in FIG. 12 would be approximately the trace shown in FIG. 13. The increase in signal amplitude is undesirable as the ideal frequency response would have a trace that was substantially flat. If the test probe tip 140 were made of resistive material 160, then the equivalent circuit would be the circuit of FIG. 14. If resistance (R) is optimized, a substantially flat frequency response such as that shown in FIG. 15 could be achieved. Some simulations were performed to determine the optimum value of resistance. The resistance is proportional to the impedance of the transmission line ($\sqrt{L/C}$) as well as inversely proportional to the square root of the length. Based on the above considerations, an initial point at which the resistance could be set would follow the formula of $R_1 = 0.75 \times (\sqrt{L_1/(C_1 \times \text{Length})})$. In this equation, $R_1$, $L_1$, and $C_1$ are resistance, inductance, and capacitance per millimeter. Length is the probe tip length in millimeters. 0.75 is the proportional constant. For example if the probe tip is 5 mm long, the inductance is 0.787 nH/mm, and the capacitance is 0.08 pF/mm, the equation above would yield $R_1 = 33.3\Omega/\text{mm}$. $R_1$ can also be adjusted to compensate for any capacitance at connection point $V_o$.

The resistive material 160 may be stamped or molded in the proper length or shape. Alternatively, the resistive material 160 maybe cut using methods (e.g. laser cutting) suitable to provide an extremely clean cut. A traditional grinding method would probably be unsuitable for providing a "clean" cut or "clean" shape as these methods would tend to leave the resistive/conductive members 162 exposed in a brush-like manner.

Although the present invention is shown with a traditional pointed probe tip, it should be noted that alternative shapes could be constructed. For exemplary purposes only, the present invention may have a tip shaped as the probe tips described in U.S. Pat. No. 6,809,535, U.S. Pat. No. 6,650,131, U.S. Pat. No. 6,518,780, U.S. Pat. No. D444,720, and U.S. Pat. No. D444,401. These patents are assigned to the assignee of the present invention and their specifications are incorporated herein by reference. The formation of these alternative probe tips may be done using methods described in the references themselves or by methods described herein.

It should be noted that the terms "encapsulating" and "enclosed" are meant to be used to describe the present invention. For example, the term "encapsulating" does not mean completely enclosed, as the encapsulating material would leave at least the ends of at least one of the resistive/conductive members exposed.

FIRST APPLICATION OF THE PRESENT INVENTION

The resistive test probe tip described above may be used alone or in conjunction with many types of applications. This first application of the resistive test probe tip of the present invention is one preferred application. The following sections detail this first application as a resistive test probe tip 327 of a spring-loaded pogo pin test point connector 250a used with a planar probing tip 224. It should be noted, however, that the spring-loaded pogo pin test point connector 250a may be used with other test probe tips and other test point connectors regardless of whether they are described herein.

Figure 16:
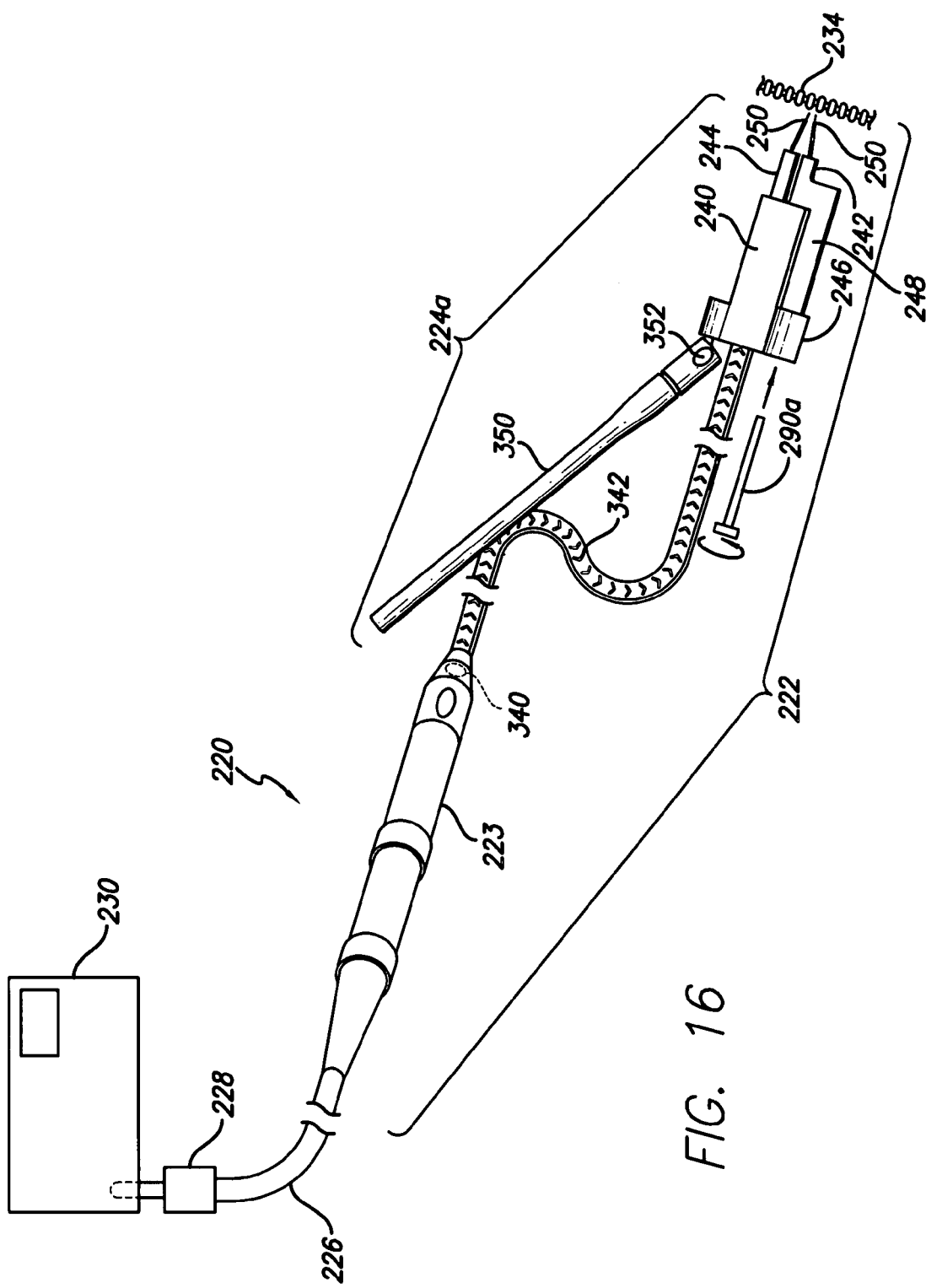
FIG. 16 is a schematic diagram of a first exemplary probing system in which the present invention may be used, the probing system including a planar probing tip implemented with a transmission line structure.

As shown in FIG. 16, an electrical test probe 220 generally consists of three parts: a probing head 222 (that, in turn, includes a main probing head gripping section 223 and a probing tip 224), a cable 226, and a probe/instrument connector 228. The probing head 222 is attached to a first end of the cable 226 and the probe/instrument connector 228 is attached to the opposite end of the cable 226. An electrical test probe 220 of the present invention may be used to provide an electrical connection between testing instruments 230 and electrical components 232 and/or connection mechanisms 234.

Figure 17:
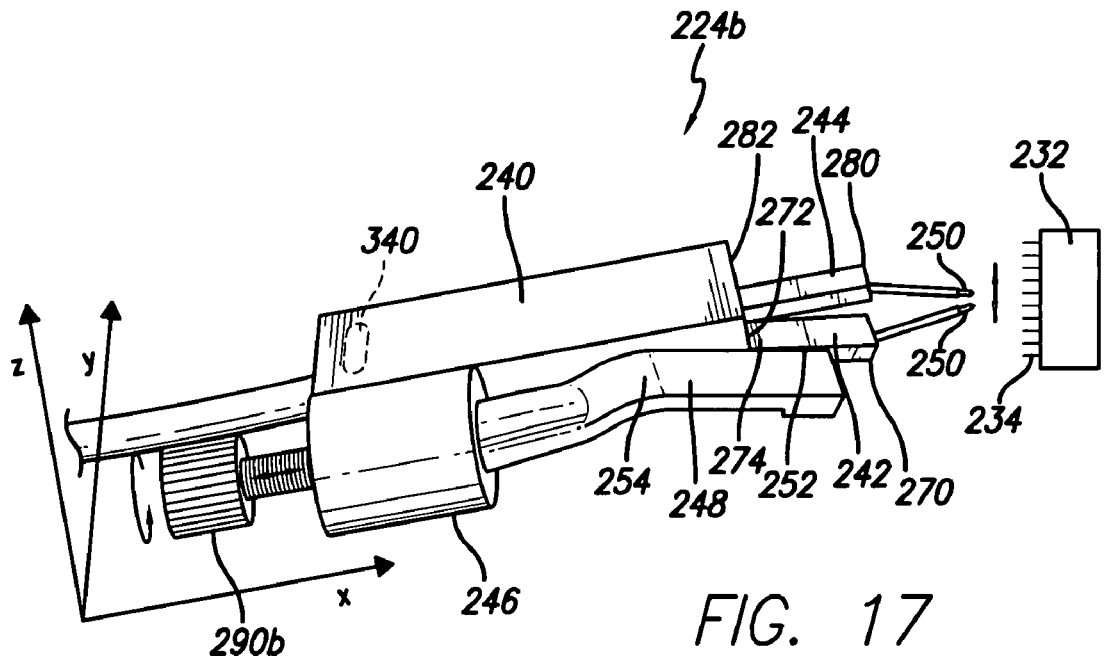
FIG. 17 is a perspective view of a second exemplary embodiment of a planar probing tip of the present invention in substantially closed relationship.
Figure 18:
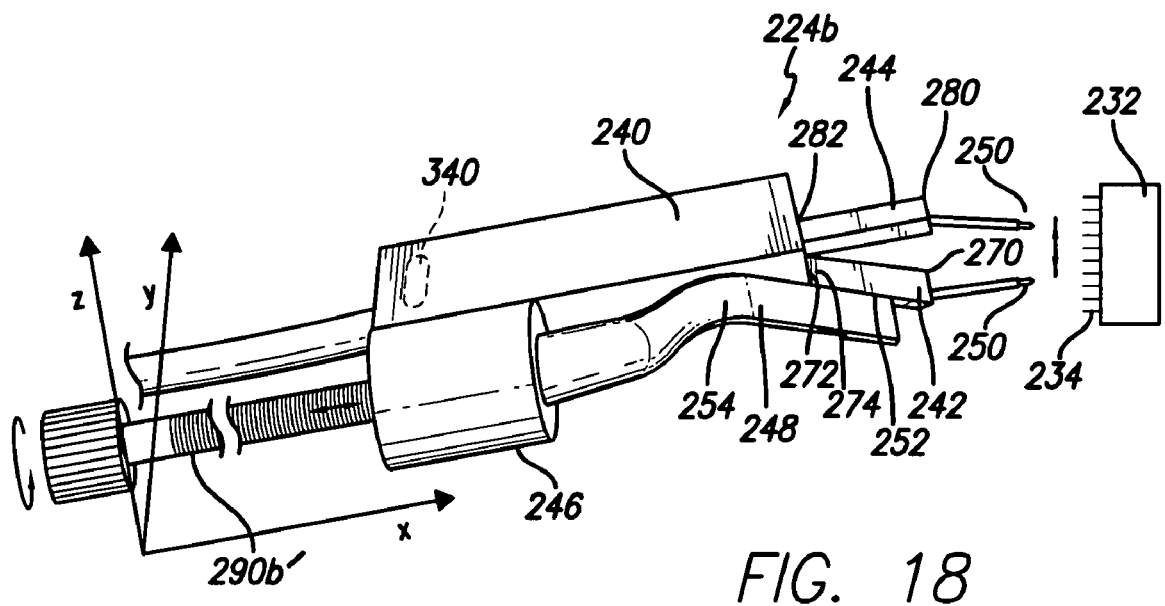
FIG. 18 is a perspective view of the second exemplary embodiment of the planar probing tip of FIG. 17 in substantially open relationship.
Figure 19:
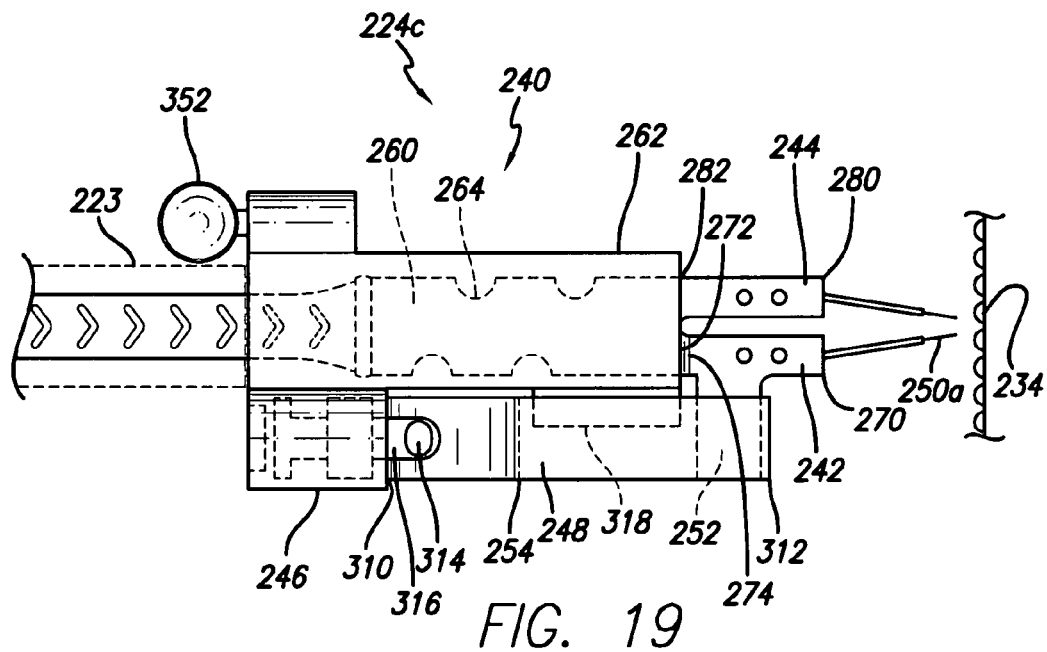
FIG. 19 is a top plan view of a third exemplary embodiment of a planar probing tip of the present invention with internal components shown in phantom, the planar probing tip having a body with two test point connector projections, each test point connector projection associated with at least one test point connector in an expanded state.
Figure 20:
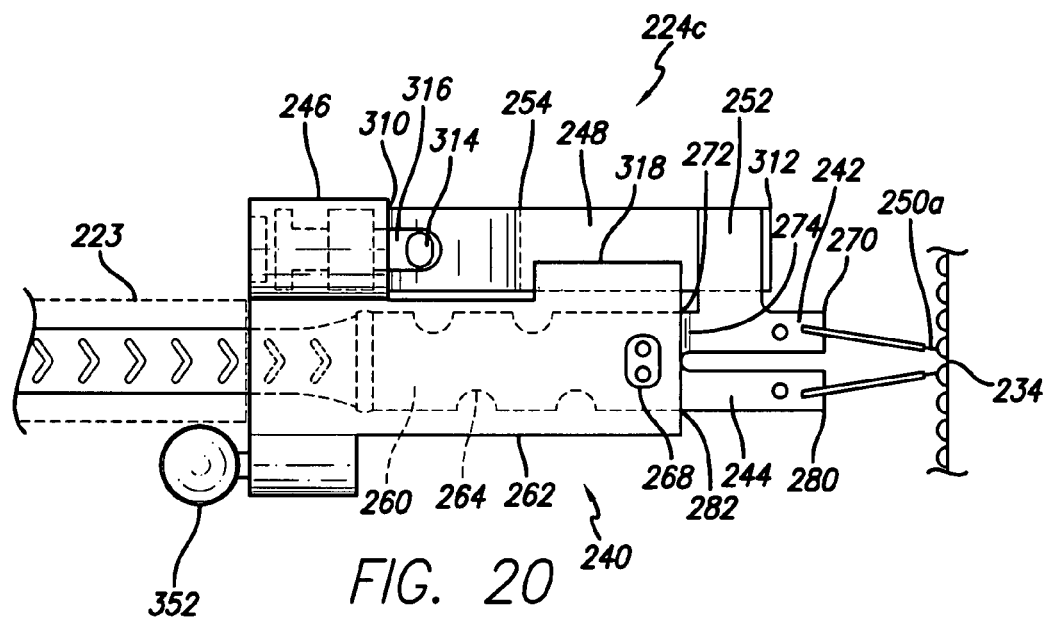
FIG. 20 is a bottom plan view of the third exemplary embodiment of the planar probing tip of FIG. 19 with the test point connectors in a contracted state.
Figure 24:
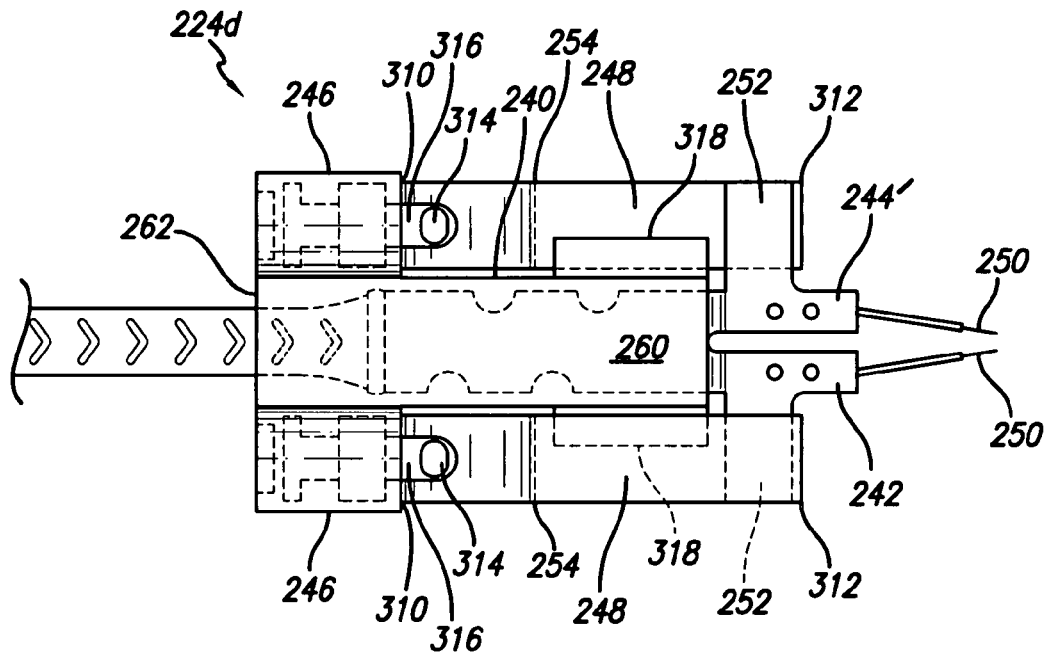
FIG. 24 is a top plan view of a fourth exemplary embodiment of a planar probing tip of the present invention with internal components shown in phantom, the planar probing tip having a body with two motion activatable test point connector projections, each motion activatable test point connector projection having an associated motion actuator.
Figure 25:
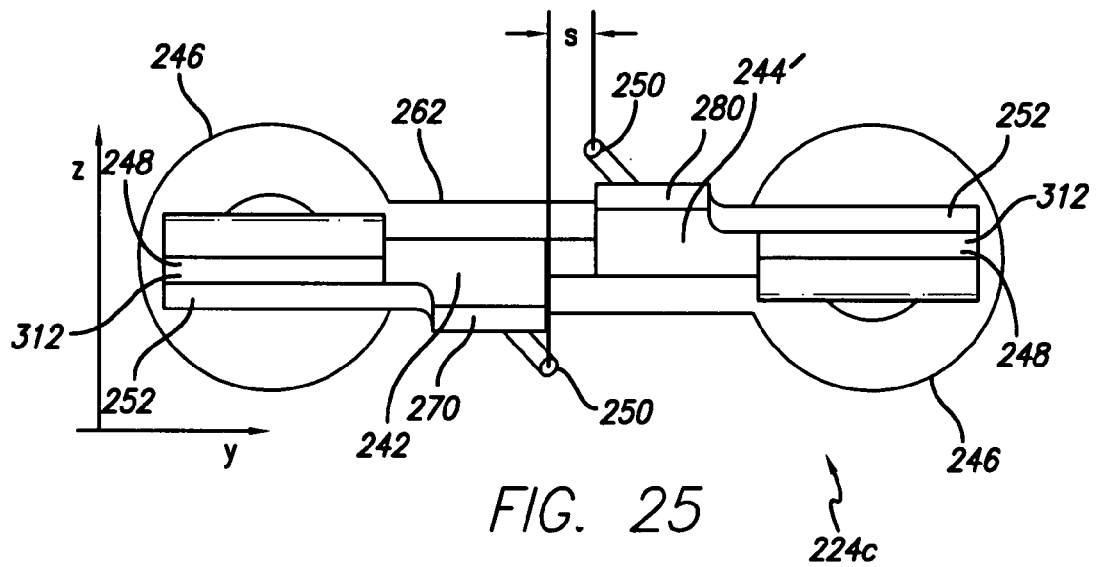
FIG. 25 is a front end view of the planar probing tip of FIG. 24.

The present invention is directed to a planar probing tip, exemplary alternative embodiments of which are shown in FIG. 16 as a planar probing tip 224a with transmission line structure, in FIGS. 17 and 18 as a planar probing tip 224b with a thumb screw, in FIGS. 19 and 20 as a planar probing tip 224c with an adjacent replaceable main probing head gripping section 223, and in FIGS. 24 and 25 as a planar probing tip 224d with dual movement. Before detailing the individual exemplary embodiments, the following paragraphs detail exemplary preferred characteristics of the probing tips 224a-d. The exemplary probing tips 224a-d are referred to generally as probing tip 224.

Figure 26:
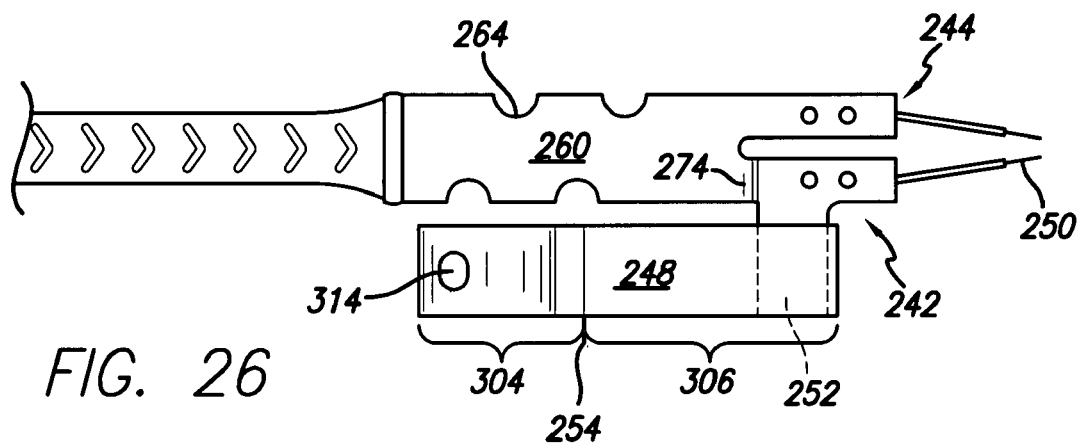
FIG. 26 is a top view of exemplary body and test point connector projections of a planar probing tip of the present invention.
Figure 27:
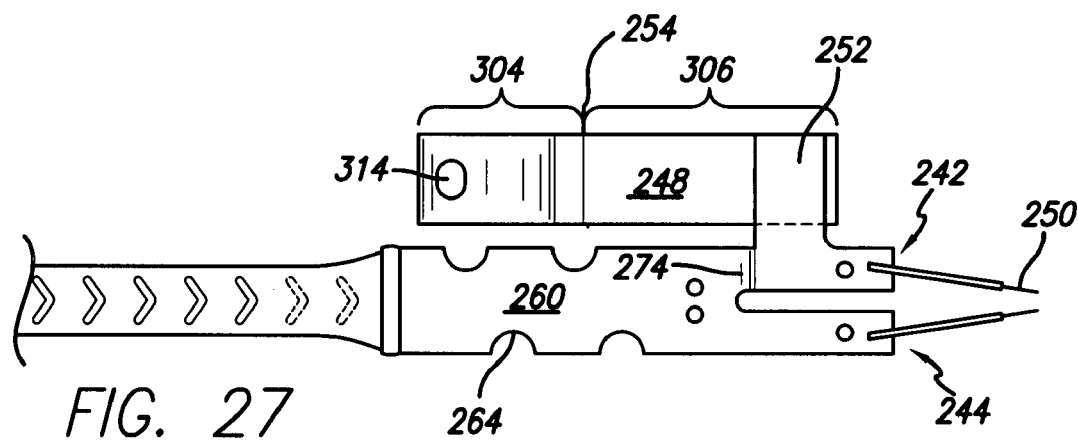
FIG. 27 is a bottom view of exemplary body and test point connector projections of a planar probing tip of the present invention.
Figure 28:
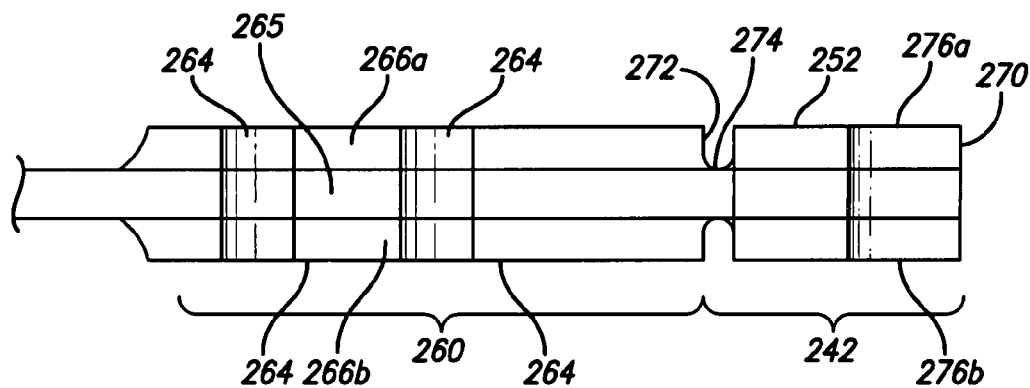
FIG. 28 is a side view of an exemplary body and test point connector projection of the planar probing tip of the present invention.
Figure 29:
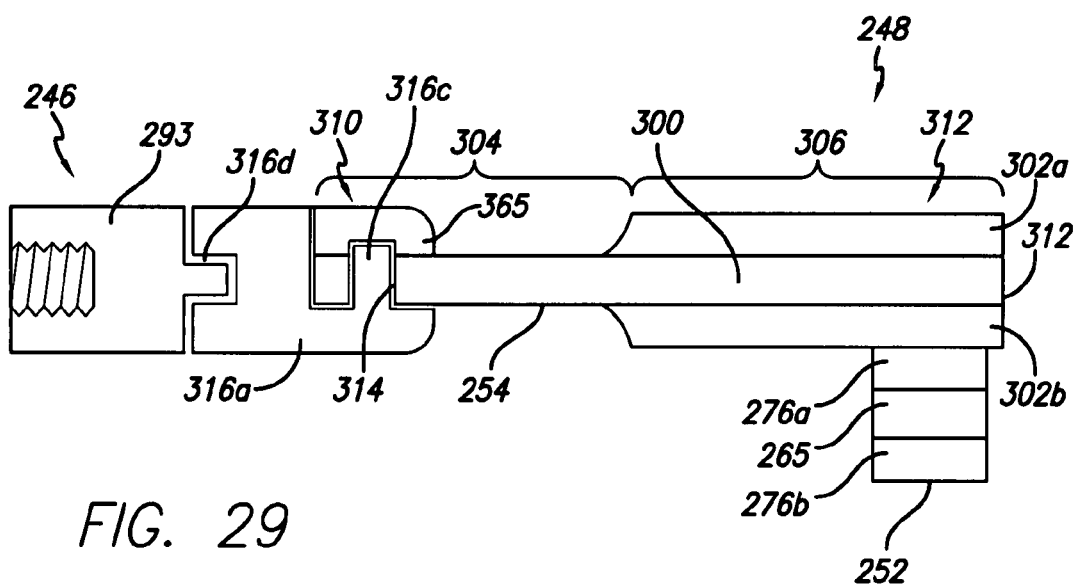
FIG. 29 is a cross-sectional side view of an exemplary motion translator of the planar probing tip of the present invention.
Figure 30:
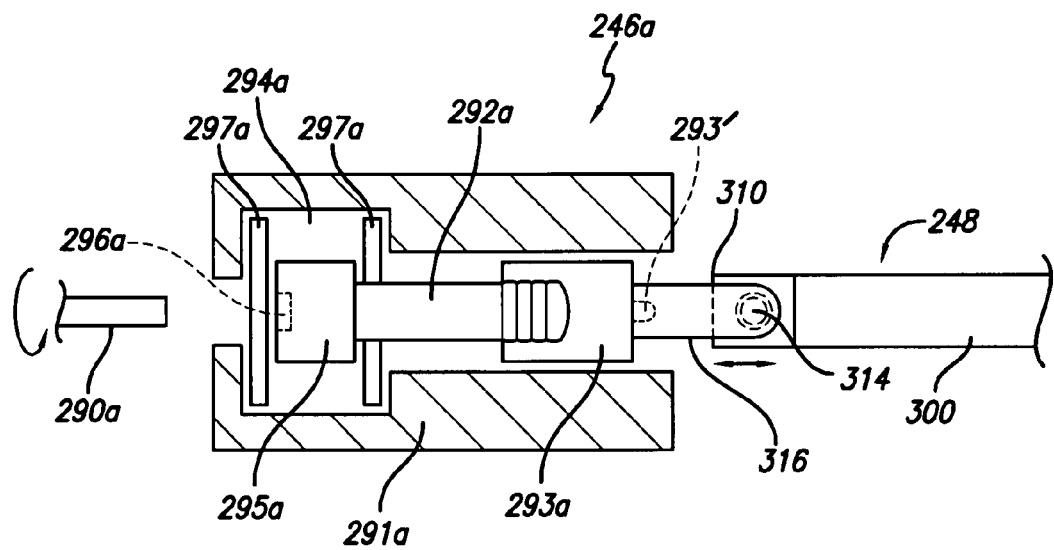
FIG. 30 is a cross-sectional top view of a first exemplary motion actuator.
Figure 31:
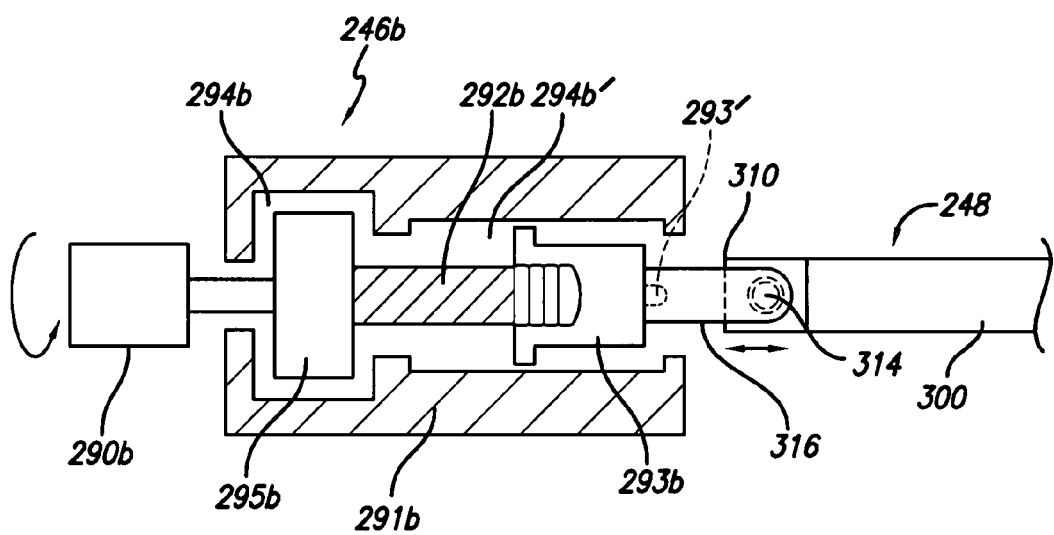
FIG. 31 is a cross-sectional top view of a second exemplary motion actuator.
Figure 32:
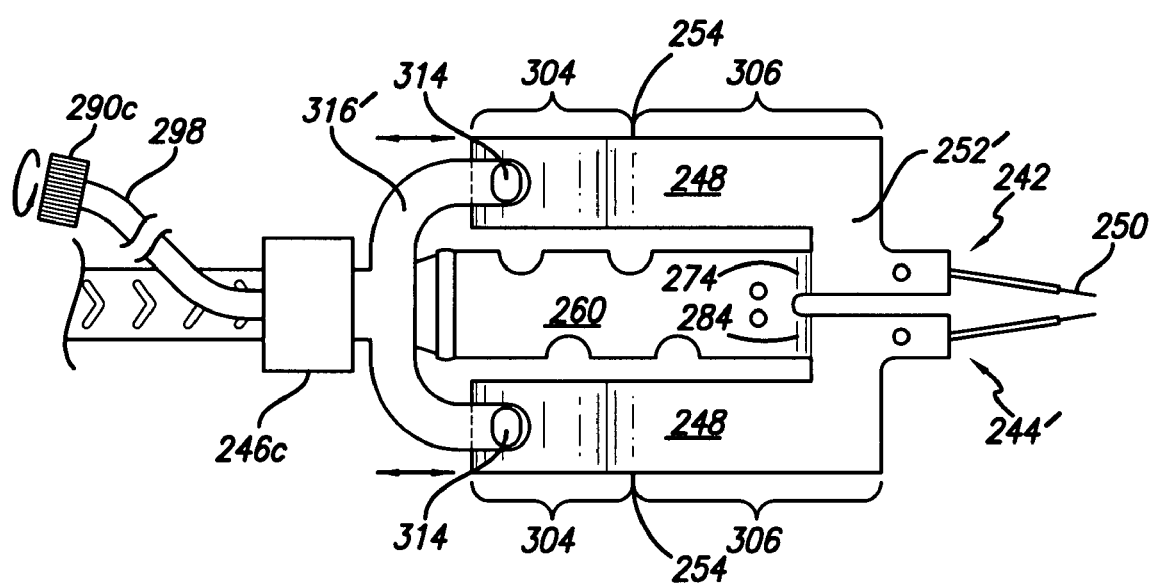
FIG. 32 is a top plan view of an exemplary body with two integral movable test point connector projections and their respective integral motion translators, a third exemplary motion actuator is connected to both motion translators, the third exemplary motion actuator being remotely actuatable.

In the shown embodiments, the planar probing tip 224 has a substantially planar body 240 (exemplary internal components of which are shown in FIGS. 26-28), a first test point connector projection 242 (shown in side view in FIG. 28), a second test point connector projection 244, at least one motion actuator 246, and at least one motion translator 248 (shown in side view in FIG. 29). Detailed exemplary embodiments of the motion actuator 246 are shown in FIGS. 30-32 as motion actuators 246a, 246b, and 246c. Each test point connector projection 242, 244 is designed to hold or be associated with at least one test point connector 250 (e.g. signal testers shown as a spring-loaded pogo pin 250a in FIGS. 33-34, as a flexible spring probe tip 250b in FIG. 35, and as a notched probe tip 250c in FIG. 36). The motion translator 248 is connected or linked (via link 252, 252') to a test point connector projection 242, 244 such that when the motion translator 248 moves, the associated linked test point connector projection 242, 244 also moves.

Figure 22:
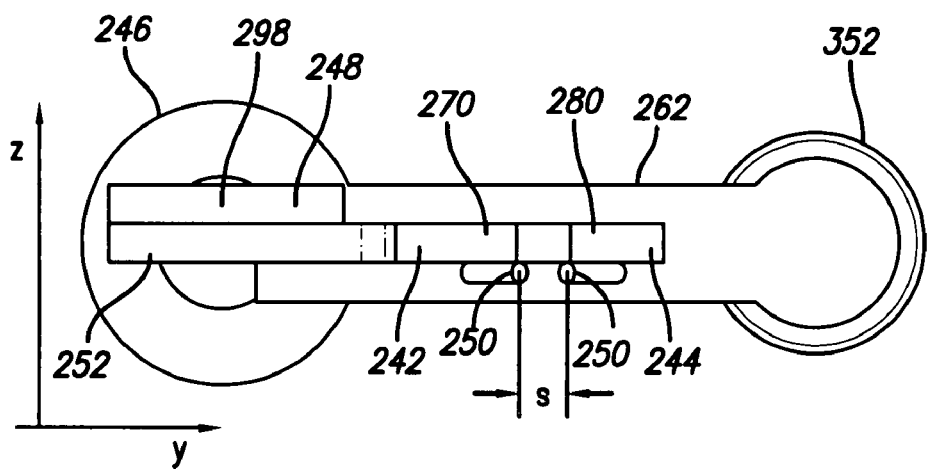
FIG. 22 is a front end view of a planar probing tip in a substantially closed position.
Figure 23:
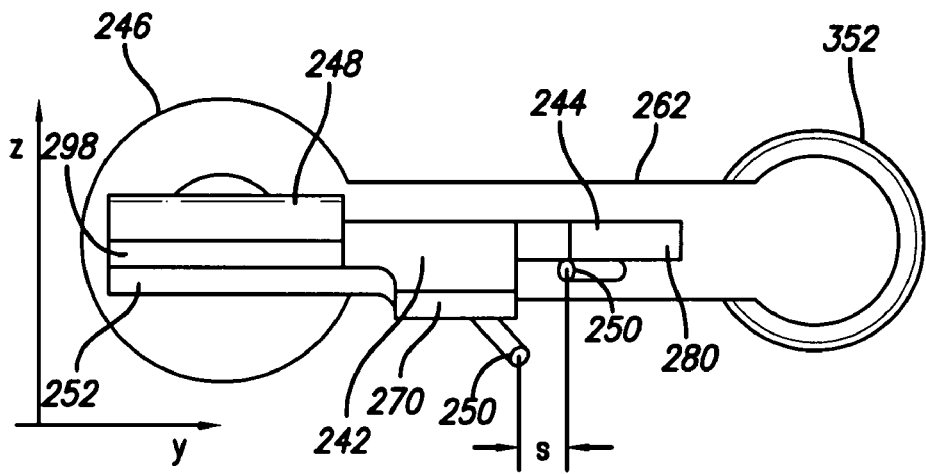
FIG. 23 is a front end view of a planar probing tip in a substantially open position.

In practice, if a probing tip 224 is in a closed position (e.g. the connectors 250 are close together as shown, for example, in FIGS. 17, 19, 20, 22, and 24) and a user wants to widen the distance between the connectors 250 (e.g. open the probing tip 224 to an at least partially open position such as those shown, for example, in FIGS. 18, 23, and 25), the user would actuate the motion actuator 246. In one preferred embodiment, the motion actuator 246 would ultimately (directly or indirectly) actuate motion in a linear direction x (forward for opening). Because the motion actuator 246 is functionally attached to the motion translator 248, the motion translator 248 "translates" or "converts" the motion of the motion actuator 246. The motion translator 248 is connected or linked (via link 252) to a movable test point connector projection 242. Because the distance between the motion actuator 246 and the link 252 is fixed, the motion translator 248 cannot go forward, but instead flexes at or near hinge mechanism 254. If the hinge mechanism 254 moves upward (e.g. peaks), the remote end of the motion translator 248 moves downward. If the hinge 254 moves downward (e.g. valleys), the remote end of the motion translator 248 moves upward. The linked movable test point connector projection 242 moves in the same direction with the remote end of the motion translator 248. Causing the motion actuator 246 to actuate motion in a backward linear direction x (for closing), the motion translator 248 would "flatten," the hinge mechanism 254 would move back to its original position, and the linked movable test point connector projection 242 would move back to its original closed planar configuration.

Another way to describe how the probing tip 224 of the present invention works is that the user actuates the motion actuator 246 to initiate the movement of at least one test point connector projection 242, 244 such that the relative distance between the ends of the test point connector projections 242, 244 varies. In a preferred embodiment, when the relative distance between the ends of the test point connector projections 242, 244 is small (the closed position), the body 240 and test point connector projections 242, 244 are substantially planar (e.g. in the x-y plane that is shown as a horizontal plane). In a preferred embodiment, when the relative distance between the ends of the test point connector projections 242, 244 is relatively large (the open position), at least one test point connector projection 242 projects outward (e.g. in a third dimension represented by vector z)

at an angle from the x-y plane. In other words, in the closed position, the test point connector projections 242, 244 are substantially planar (e.g. in a horizontal plane), but in the open position, at least one of the test point connector projections 242, 244 is moved off (or out of) the plane such that there is a distance (e.g. vertical to the original horizontal plane) between the test point connector projections 242, 244. This can be seen clearly by comparing FIG. 22 (closed position) with FIGS. 23 and 25 (open position). In FIG. 22, the test point connector projections 242, 244 are substantially planar such that they are aligned (at the same level) in relation to axis z. In FIGS. 23 and 25, however, the test point connector projections 242, 244 are at different levels on axis z. It should be noted, that in both the open and closed positions, the distance S between the test point connector projections 242, 244 along axis y is substantially constant. Put yet another way, if the planar probing tip 224 (e.g. the body 240 and test point connector projections 242, 244) are substantially planar, the movement between the test point connector projections 242, 244 is substantially perpendicular to the planar probing tip 224. It should be noted that the terms "horizontal" and "vertical" are relative terms and are not meant to limit the scope of the invention as the probing tip 224 can be used in any position.

One advantage of the probing tip 224 of the present invention is that it has a flat/planar configuration (at least the body 240 and the test point connector projections 242, 244 in the closed position) that may allow access to narrow slots not accessible by known differential probing heads. Another advantage of the discussed configurations is that they include a ground plane loop that is made relatively short. This would allow a probing tip 224 having this structure to go to 8 GHz or higher. Yet another advantage of many of the embodiments of the probing tip 224 of the present invention is that they may be made as a single mechanical piece that helps in manufacturing, cost, and durability. Finally, in the exemplary embodiments of the probing tip 224, the motion and pivot are very small as compared to other known probing tips. Minimal geometry, motion, pivot, and mechanics cause only tiny changes in the size of the electrical path as it transitions between the open and closed positions. These changes are electrically nearly negligible. As compared to other known probing tips that have more significant changes, the relative minimal changes extend the bandwidth performance and otherwise enable superior performance.

The following paragraphs provide details of exemplary embodiments of the individual components of the present invention.

The body 240 of the planar probing tip 224 includes or supports a portion of the transmission path (e.g. a path that may be in the form of traces, wires, or other transmission means for carrying signals) that allows signals to be transmitted, for example, from the test point connector 250, through the probing head 222, cable 226, and probe/instrument connector 228, and to a testing instrument 230. In the shown embodiment, the body 240 is constructed at least partially from a flexible substrate 260 (shown in detail in FIGS. 26-29) or other type of flexible circuit board material enclosed within a body housing 262. The body flexible substrate 260 may include notches 264 or projections to help prevent the body flexible substrate 260 from shifting, moving, or rotating within the body housing 262. The body flexible substrate 260 may be coated or otherwise reinforced (shown as layers 266a and 266b in FIG. 28). Electronic components (e.g. transmission paths, traces, resistors, and capacitors) may be incorporated into or supported by the body 240. A body housing 262 may enclose all or part of the body flexible substrate 260. For purposes of example only, the body housing 262 may have a two-piece construction that is snap fit around the body flexible substrate 260. Alternatively, the body housing may be a single unit (e.g. a tube) with openings in which the body flexible substrate 260 with caps or end pieces completing the enclosure. Still another possibility would be to use an over-molding technique to enclose the body flexible substrate 260. In the shown embodiments, the test point connector projections 242, 244 extend from the body 240 and out through at least one opening of the body housing 262. As shown in FIG. 20, the body housing 262 may include one or more openings or windows 268 (e.g. a dielectric relief). A window 268 defined in a body housing 262 may, for example, provide access to optional components (e.g. passive components such as a capacitor or a resistor).

The first test point connector projection 242 includes or supports a portion of the transmission path that allows signals to be transmitted, for example, from the associated test point connector 250 to the transmission path of the body 240. The first test point connector projection 242 has a test connection end 270 and a body end 272 (FIGS. 19 and 20). The first test point connector projection body end 272 is movably attached to the body flexible substrate 260 of the body 240 to allow motion therebetween. In preferred embodiments, a hinge mechanism 274 (such as flex) between the first test point connector projection body end 272 and the body flexible substrate 260 provides a flexible connection therebetween. As shown in FIG. 28, the hinge mechanism 274 may be constructed using a single piece of flexible substrate 265 to create the combined body flexible substrate 260, first test point connector projection 242, and hinge mechanism 274. As discussed above, the body flexible substrate 260 may be coated or otherwise reinforced (shown as layers 266a and 266b). The first test point connector projection 242 may be similarly coated or otherwise reinforced (shown as layers 276a and 276b). The hinge mechanism 274 itself is uncoated or reinforced and, therefore, bendable. In one preferred embodiment, the flex of the hinge mechanism 274 may serve dual functions as both a flexible connection and as at least part of a transmission path (e.g. if a flexible trace is defined in the flex). As set forth above, the flex hinge mechanism 274 between the test point connector projection body end 272 and the body flexible substrate 260 may provide a flexible connection therebetween (e.g. function as a hinge). Further, the flex hinge mechanism 274 between the test point connector projection body end 272 and the body flexible substrate 260 may integrate (or support) the transmission path. The transmission path passes through the flex hinge mechanism 274 with little or no electrical alteration during actuation. By serving a dual purpose, the flex hinge mechanism 274 also reduces the number of mechanical parts needed in the probing tip 224. In alternative embodiments, alternative hinge mechanisms 274 (e.g. mechanical hinges) may be used to provide a flexible connection between the first test point connector projection body end 272 and the body flexible substrate 260.

The second test point connector projection 244 includes or supports a portion of the transmission path that allows signals to be transmitted, for example, from the associated test point connector 250 to the transmission path of the body 240. The second test point connector projection 244 has a test connection end 280 and a body end 282 (FIGS. 19 and 20). The second test point connector projection body end 282 is attached to the body flexible substrate 260 of the body 240. In some embodiments (e.g. the embodiments of FIGS. 15-20 and 22-23), the second test point connector projection 244 is fixed. In a fixed embodiment, the second test point connector projection 244 may be coated or otherwise reinforced (not shown). In a fixed embodiment, the coating or reinforcement of the second test point connector projection 244 may be integral with, continuous with, adjacent to, or overlapping the body flexible substrate 260 coating or reinforcement (shown as layers 266a and 266b). In alternate embodiments (e.g. the embodiment of FIGS. 24-25), the second test point connector projection (shown as second test point connector projection 244') is movable (e.g. the second test point connector projection body end 282 is movably attached to the body flexible substrate 260 to allow motion therebetween). A movable second test point connector projection 244' may include a hinge mechanism 284 (which may have a similar structure to the structure shown and discussed for hinge mechanism 274) between the second test point connector projection body end 282 and the body flexible substrate 260 to provide a flexible connection therebetween.

The motion actuator 246 actuates motion between the first test point connector projection 242 test connection end 270 and the second test point connector projection 244 test connection end 280. In other words, the user actuates the motion actuator 246 to initiate the movement of at least one test point connector projection 242, 244' such that the relative distance between the test point connector projections varies. In one preferred embodiment, the motion actuator 246 actuates motion in a first linear direction (e.g. forward and backward along an x axis) that the motion translator 248 translates or converts into motion of at least one of the test point connector projections 242, 244' in a second linear direction (e.g. up and down along a z axis). A motion actuator 246 of the present invention may incorporate, for example, a screw driver, a thumb screw, a lever, a button, a knob, a dial, or a digital actuator (e.g. computerized). Another way to describe preferred embodiments of the motion actuator is that it allows torque to be converted into linear force.

Exemplary motion actuators 246a (FIG. 30), 246b (FIG. 31), and 246c (FIG. 32) are discussed in detail below.

The motion translator 248, an exemplary embodiment of which is shown in detail in FIG. 29, translates or converts input from the motion actuator 246 to a moveable test point connector projection 242, 244'. In one preferred embodiment of the present invention, the motion translator 248 may be made of a flexible substrate 300 that is at least partially coated or reinforced (shown as layers 302a and 302b). In an alternative preferred embodiment of the present invention, the motion translator 248 is divided into at least two sections, a flexible first section 304 and a rigid second section 306. The flexible first section 304 is made from a flexible substrate or a jointed or hinged rigid material. Alternatively or in addition, a hinge mechanism 254 may divide the two sections 304, 306 to allow motion therebetween. The hinge mechanism 254 may be the flexible substrate 300 itself, a score in the flexible substrate, or a mechanical hinge. The motion translator 248 is functionally attached substantially at a first end 310 to the motion actuator 246 and substantially at a second end 312 to a moveable test point connector projection 242, 244'. In one preferred embodiment, the first end 310 of the motion translator 248 has a bore 314 therethrough. A connector 316 (FIGS. 30 and 31) mates with the bore 314 at the first end 310 of the motion translator 248 and extends to (and connects with) the motion actuator 246. For example, as shown in FIG. 29, a connector 316 may include a connector bottom molded piece 316a and a connector top molded piece 316b that are connected by the projection 316c that extends through the bore 314. The connector 316 may also include a bore 316d that mates with a projection 293' of the directional movement part 293 of the motion actuator 246. The connector 316 may be a molded piece or molded pieces, adhesive, plastic, and/or rubber).

FIG. 32 shows an exemplary connector 316' that might be used for connecting a single exemplary motion actuator 246c to a plurality of motion translators that, in turn, are attached respective test point connector projections. In this shown embodiment, the connector 316' is "Y-shaped" connector 316' such that the upper prongs mate with respective motion translators 248 and the lower prong mates with the motion actuator 246c. Alternative embodiments of the connector 316' that allow a single motion actuator 246c to actuate a plurality of motion translators and respective test point connector projections might be V-shaped (e.g. with the upper prongs mating with respective motion translators and the lower point mating with the motion actuator), T-shaped (e.g. with the T-shaped connector running between the test point connector projections and connecting to the inner edges thereof, or fork-shaped (e.g. for more than two moveable test point connector projections). In one preferred embodiment, the second end 312 of the motion translator 248 is connected to a moveable test point connector projection 242, 244' using a link 252, 252'.

The link 252 may be any connection means including, but not limited to a tab, adhesive, a connector, integral layers of flex and rigid built in the PCB (printed circuit board) fabrication process, or any device with appropriate electrical properties that can be used to connect the motion translator 248 and the associated test point connector projection 242, 244. In the shown embodiments, the link 252 is shown as being integrally formed with a test point connector projection 242 (and in FIGS. 24 and 25, with both test point connector projections 242, 244') and attached to a motion translator 248. In alternative embodiments, the link may be integrally formed with a motion translator 248 and attached to a test point connector projection 242. FIG. 32 shows an alternative embodiment of a link 252' that is implemented by at least partially integrally forming the motion translator 248 and the associated test point connector projection 242, 244' (e.g. at least part of the motion translator 248 and the associated test point connector projection 242, 244 being fabricated from the same material such as the flex and/or reinforcement material).

Optional motion limiters 318 (e.g. as shown in FIG. 24) may be used to help direct the appropriate hinging action of the hinge mechanisms 254. The motion limiters 318 may take the form of a back stop or projection. The motion limiters 318, as shown, may be attached to or integral with the body housing 262. In embodiments in which the hinge mechanisms 254 could hinge in either direction (e.g. a flexible substrate may be designed to bend or hinge both to the front and to the back), the use of a motion limiter 318 would provide certainty as to which way the hinge mechanisms 254 would hinge. Alternatively, the hinge mechanisms 254 could hinge in only one direction. If the hinge mechanisms 254 were unidirectional, then the motion limiter 318 would be substantially redundant.

Figure 35:
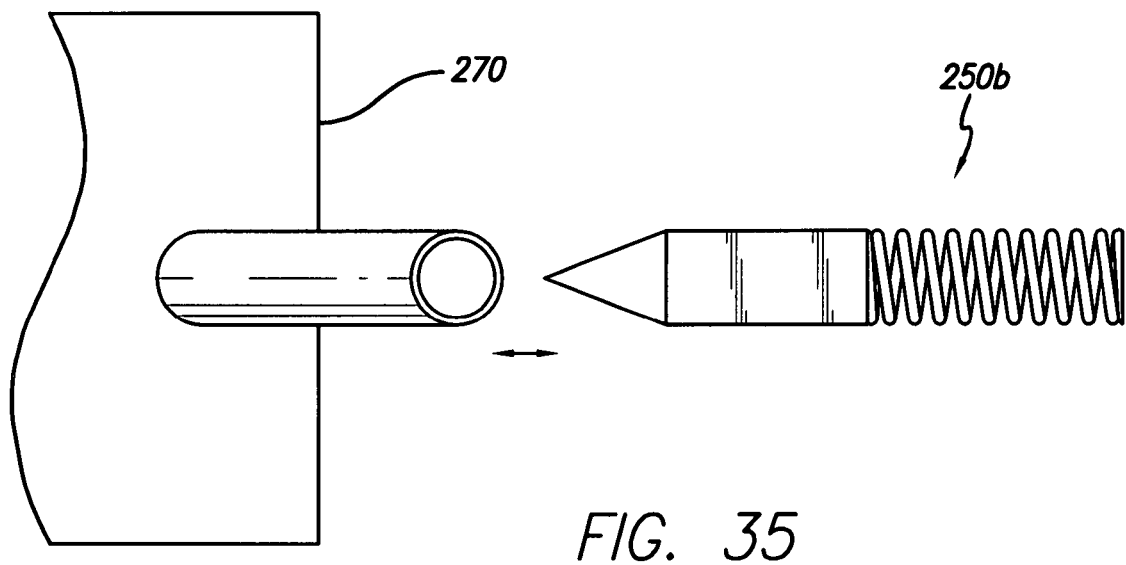
FIG. 35 is a top view of a test point connector projection with a replaceable test point connector, the replaceable test point connector shown as a socket and a flexible spring probe tip.

The test point connectors 250 are generally for making electrical contact with electrical component testing points such as connection mechanisms such as wires, traces, leads, legs, pins, and vias. The test point connectors 250 may be replaceable in relation to the test point connector projections 242, 244 as shown in FIG. 35. Alternatively, the test point connectors 250 may be integral in relation to the test point connector projections 242, 244 a shown in FIG. 36. In the closed position, the test point connectors 250 may be touching, substantially adjacent, or approximately the distance between two connection mechanisms 234. If the desired distance S between the test point connectors 250 in the closed position is closer than the distance between the test point connector projections 242, 244, then the test point connectors 250 may be angled (e.g. inward as shown).

The present invention may be a differential probing tip 224 or may be a single-ended probing tip 224 (e.g. where one of the test point connectors 250 functions as ground). A differential test probe measures two signals and outputs a third signal representing the difference between the first signal and the second signal.

Exemplary Motion Actuators

FIG. 30 shows a first exemplary motion actuator 246a that is implemented using an external tool 290a such as a screwdriver. One advantage of this embodiment is that a user would have to consciously choose to actuate the motion actuator 246a (as opposed to accidentally or casually actuating a motion actuator). The motion actuator 246a includes at least three parts: a motion actuator fixed part 291a being fixed in relation to the body 240, a motion actuator rotating part 292a that rotates in relation to the fixed part 291a, and a motion actuator directional movement part 293a that moves in a predetermined direction (e.g. forward and backward along axis x). In this embodiment of the motion actuator 246a, the fixed part 291a is a sleeve. The fixed part 291a contains an interior chamber 294a. The rotating part 292a is a screw (e.g. a jack screw) that includes a shaft with an external helical thread (inclined plane). The rotating part 292a has a head 295a (with a tool acceptor 296a such as a slot defined therein) that is positioned within the interior chamber 294a. Washers 297a help to hold the head 295a within the interior chamber 294a. The rotating part 292a rotates in relation to the sleeve 291a. The directional movement part 293a is a nut that has an internal helical groove that mates with the external helical thread of the rotating part 292a. As the rotating part 292a rotates, its external helical thread interacts with the internal helical groove of the directional movement part 293a causing the directional movement part 293a to move forward or backward in relation to the fixed part 291a depending on the direction in which the rotating part 292a is rotated. This configuration allows torque (from the external tool 290a) to be converted into linear force (the movement of motion actuator directional movement part 293a).

FIG. 31 shows a second exemplary motion actuator 246b that is implemented using an integral actuation mechanism 290b. In this case, "integral actuation mechanism" means that the user does not need an external tool or implement. The shown integral actuation mechanism is a thumb screw 290b. One advantage of this embodiment is the ease of use. For example, users of this embodiment would not need to look for a screwdriver and properly align the screwdriver before use. The motion actuator 246b includes at least three parts: a motion actuator fixed part 291b being fixed in relation to the body 240, a motion actuator rotating part 292b that rotates in relation to the fixed part 291b, and a motion actuator directional movement part 293b that moves in a predetermined direction (e.g. forward and backward along axis x). In this embodiment of the motion actuator 246b, the fixed part 291b is a sleeve. The fixed part 291b contains a first interior chamber 294b and a second interior chamber 294b' (defined by back and forward stops). The rotating part 292b preferably includes a shaft with an external helical thread (inclined plane) and a head 295b (that is attached to or functionally integral with the integral actuation member 290b). The head 295b is positioned within the interior chamber 294b and the directional movement part 293b is positioned within the interior chamber 294b'. The rotating part 292b rotates in relation to the sleeve 291b. The directional movement part 293b is a nut that has an internal helical groove that mates with the external helical thread of the rotating part 292b. As the rotating part 292b rotates, its external helical thread interacts with the internal helical groove of the directional movement part 293b causing the directional movement part 293b to move forward or backward in relation to the fixed part 291b depending on the direction in which the rotating part 292b is rotated. This configuration allows torque (from the integral actuation mechanism 290b) to be converted into linear force (the movement of motion actuator directional movement part 293b). It should be noted that the thumb screw may be an elongate thumb screw 290b' (FIG. 18).

FIG. 32 shows a third exemplary motion actuator 246c that is implemented using a remote actuation mechanism 290c. In this case, "remote actuation mechanism" means that there is a distance (e.g. at least 3 inches (6 centimeters)) between the motion actuator 246c and the actuation mechanism 290c. The shown remote actuation mechanism 290c is shown as a knob or dial, but it could be, for example, a lever, a joy stick, or a digital actuator (e.g. computerized). The remote actuation mechanism 290c may be separated from the motion actuator 246c by an extender 298 such as a cable or a wireless connection. The extender 298 could be attached to a thumb screw (not shown) or directly to a rotating part (not shown). Use of an extender would allow the user to remotely actuate the rotating part 292b. One advantage of using an extender is that it improves visibility. Another advantage of using an elongate thumb screw or an extender is that it may be easier for a user to use or access. Yet another advantage of using an extender is that isolates unwanted motion (e.g. only the actuation would be transmitted, not shaking or unwanted motion of the user).

Some of these advantages may also be applicable to the elongate thumb screw 290b' of FIG. 18.

It should be noted that the size of the motion actuator 246 is meant to be exemplary. A smaller motion actuator 246 (e.g. of the same thickness as the body 240) would allow the probing tip 224 to be inserted in narrower spaces.

Transmission Line Structure

In one preferred embodiment shown in FIG. 16, the planar probing tip 224 is implemented with a transmission line structure. In this embodiment, the planar probing tip 224 is divided such that the test point connectors 250 are separated from a differential amplifier 340 by an elongate common substrate 342. In this embodiment, the body 240 is the portion of the probing tip 224 substantially adjacent to the test point connectors 250.

In embodiments of the present invention that are implemented using a transmission line structure, the transmission line structure technology may be the technology described in U.S. Pat. No. 6,822,463 (entitled Active Differential Test Probe With A Transmission Line Input Structure) and U.S. patent application Ser. No. 10/995,801 (entitled Transmission Line Input Structure Test Probe). These references have been assigned to LeCroy Corporation (the assignee of the present invention) and are hereby incorporated by reference. In a preferred embodiment of the present invention that incorporates a transmission line structure (e.g. as shown in FIG. 16), a differential electrical test probing tip 224 may be used for sensing a plurality of electric signals and generating a differential signal. The differential electrical test probing tip 224 includes an elongate common substrate 342 having two test point connectors 250 (signal testers) at one end and a differential amplifier 340 at the second end. Two transmission lines are on the common substrate 342, each connecting a respective signal test point to a signal input of the differential amplifier 340. The characteristic impedances of the two transmission lines are substantially equal. In one preferred embodiment, the common substrate 342 is a flexible substrate 342. In one preferred embodiment, an overmold, which may have gaps therein, at least partially encloses the common substrate 342, the first transmission line, and the second transmission line.

In the alternative preferred embodiment shown in FIGS. 17 and 18, the probing tip 224b includes a differential amplifier 340. In this embodiment, the differential amplifier 340 and test point connectors 250 are not separated. In this unitary embodiment, the body 240 may include an attached or integral differential amplifier 340.

It should be noted that other alternative preferred embodiments may not include a differential amplifier 340.

Test Point Connectors

The test point connectors 250 are generally for making electrical contact with electrical component testing points. The testing points may be connection mechanisms that could be wires, traces, leads, legs, pins, and vias.

The test point connectors 250 may be replaceable in relation to the test point connector projections 242, 244 as shown in FIG. 35. Replaceable test point connectors 250 are test point connectors that are meant to be easily removed and replaced. Sockets or specially designed connectors may be used for this purpose. For example, the outer sleeve 320 in FIGS. 33-34 may function as a socket into which a removable and replaceable inner sleeve 321 (which contains the inner structure of a spring-loaded pogo pin test point connector 250a) may be positioned.

Figure 36:
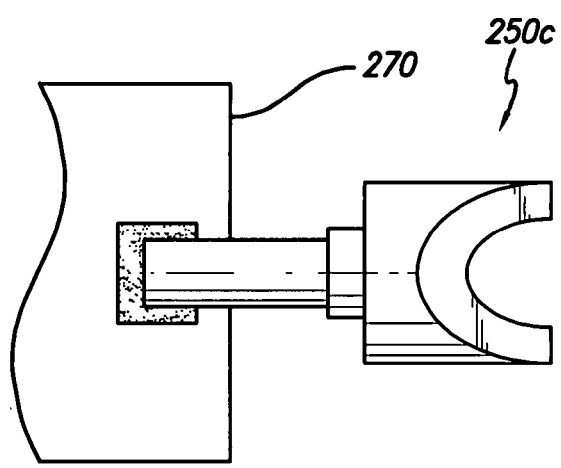
FIG. 36 is a top view of a test point connector projection with an integral test point connector, the integral test point connector shown as a notched probe tip.

Alternatively, the test point connectors 250 may be integral in relation to the test point connector projections 242, 244 as shown in FIG. 36. Integral test point connectors 250 are test point connectors that are not meant to be removed. They may be fabricated integrally or permanently attached (such that substantial manipulation or breakage is required for removal) to the projections 242, 244.

Figure 33:
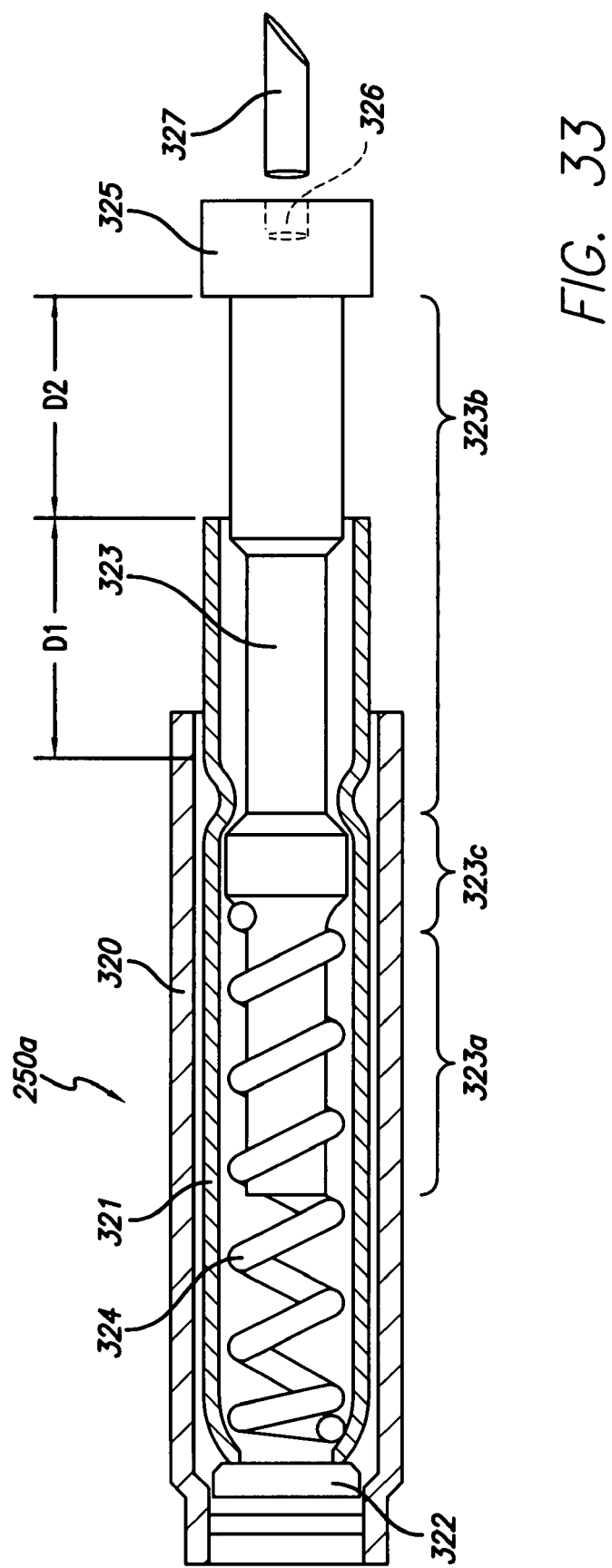
FIG. 33 is a cross-sectional view of an exemplary spring-loaded pogo pin test point connector in an expanded state.
Figure 34:
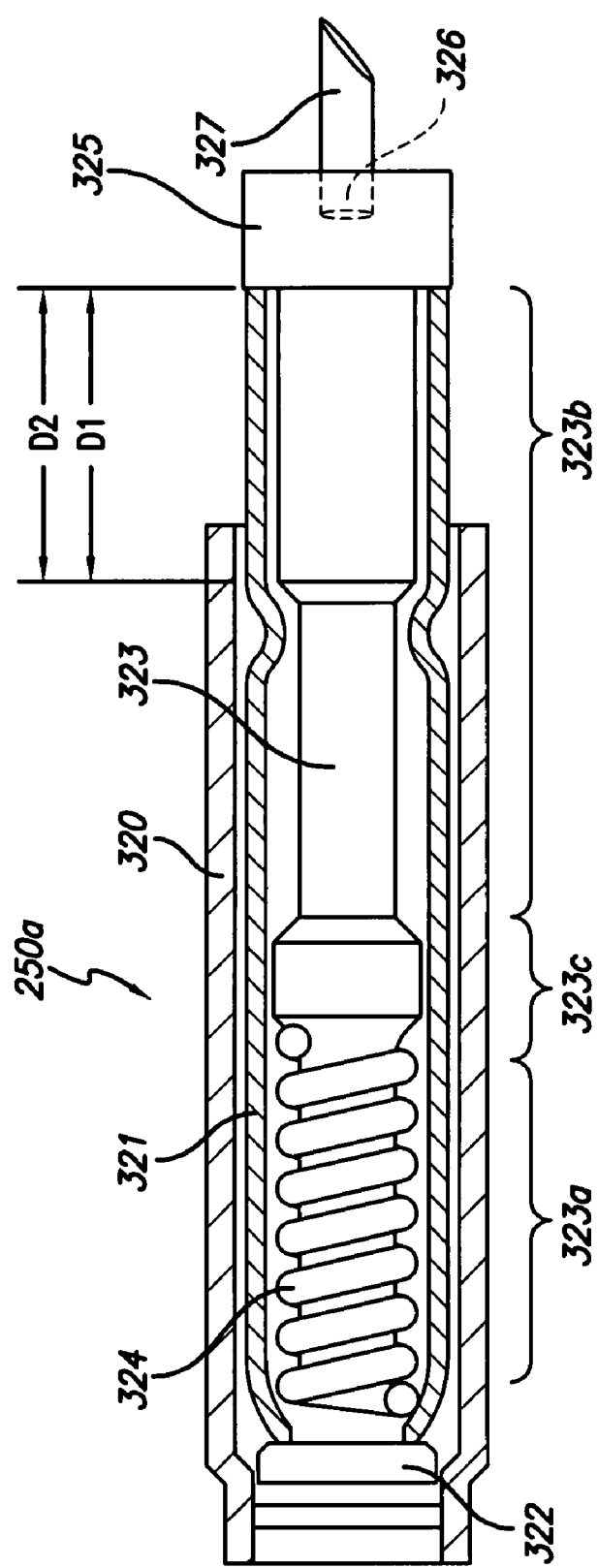
FIG. 34 is a cross-sectional view of an exemplary spring-loaded pogo pin test point connector in a contracted state.

The test point connector 250a shown in FIGS. 33-34 is a spring-loaded pogo pin. A pogo pin is generally used to contact pads on a circuit board. FIGS. 19 and 33 show the pogo pin test point connectors 250a being in an expanded/ extended position. FIGS. 20 and 34 show the pogo pin test point connectors 250a being in a retracted position. The test point connector 250a shown in FIGS. 33-34 includes an outer sleeve 320, an inner sleeve 321, a conductive base 322 (at the end of inner sleeve 321), a shaft 323 (having a back spring section 323a and a front tip section 323b that are separated by a divider section 323c), a spring 324, a shoulder test point connector holder 325 (having a test point connector receptacle 326 defined therein), and a test probe tip 327 (positionable within the test point connector receptacle 326). The spring 324 wraps around at least part of the back spring section 323a of the shaft 323 and provides an outward force tending to push the spring-loaded pogo pin test point connector 250a into an expanded/extended position (FIG. 33). Putting sufficient force on the test probe tip 327 overcomes the spring's force such that the spring 324 compacts, and the shaft 323 slides into the inner sleeve 321 (FIG. 34). In one preferred embodiment, the shaft 323 only slides into the inner sleeve 321 until the shoulder test point connector holder 325 comes in contact with the annular rim of the inner sleeve 321. If the test probe tip 327, shoulder test point connector holder 325, and inner sleeve 321 are made of material suitable for conducting a signal, the signal will flow therethrough to the conductive base 322 and through the transmission path of the present invention. In effect, the shoulder test point connector holder 325 coming into contact with the inner sleeve 321 "short circuits" the interior components (e.g. the shaft 323 and the spring 324). In the shown preferred embodiment, the length D1 is greater than or equal to the length D2. In one preferred embodiment, the test probe tip 327 of the spring-loaded pogo pin test point connector 250a is constructed substantially from resistive material made of resistive conducting material substantially enclosed in and dispersed throughout encapsulating material. This material is described above and in U.S. patent application Ser. No. 11/018,133 (entitled Resistive Probe Tip) and PCT Application No. PCT/US04/43884 (entitled Resistive Probe Tip), both of which have been assigned to LeCroy Corporation (the assignee of the present invention), and are hereby incorporated by reference.

One alternative test point connector 250 includes a test probe tip 327 constructed substantially from resistive material (a resistive test probe tip 327) that is described in U.S. patent application Ser. No. 11/018,133 (entitled Resistive Probe Tip) and PCT Application No. PCT/US04/43884 (entitled Resistive Probe Tip), both of which have been assigned to LeCroy Corporation (the assignee of the present invention) and are hereby incorporated by reference. Another alternative test point connector 250 is the wedge test probe tip described in U.S. Design Patent No. D444,401 (entitled Electrical Test Probe Wedge Tip), U.S. Pat. No. 6,518,780 (entitled Electrical Test Probe Wedge Tip), and U.S. Pat. No. 6,650,131 (entitled Electrical Test Probe Wedge Tip), all of which issued to LeCroy Corporation (the assignee of the present invention) and are hereby incorporated by reference. The general shape of this wedge shaped alternative test point connector 250 is shown as the "point" in FIGS. 33 and 34. As shown in FIG. 35, still another alternative test, point connector 250b is the flexible spring probe tip described in U.S. Pat. No. 6,863,576 (entitled Electrical Test Probe Flexible Spring Tip) which issued to LeCroy Corporation (the assignee of the present invention) and is hereby incorporated by reference. As shown in FIG. 36, yet another alternative test point connector 250c is the wedge test probe tip described in U.S. Design Patent No. D444,720 (entitled Notched Electrical Test Probe Tip), U.S. Pat. No. 6,538,424 (entitled Notched Electrical Test Probe Tip), U.S. Pat. No. 6,809,535 (entitled Notched Electrical Test Probe Tip), and U.S. patent application Ser. No. 10/971,344 (entitled Notched Electrical Test Probe Tip), all of which have been assigned to LeCroy Corporation (the assignee of the present invention) and are hereby incorporated by reference. The above described test point connectors may be made from the resistive material described above or any conductive material (e.g. metal, carbon).

Probing Head

The probing head 222 of the present invention may have an integral or replaceable probing tip 224. Replaceable probing tips 224 are probing tips that are meant to be easily removed and replaced. Sockets or specially designed connectors may be used for this purpose. Alternatively, the probing tips 224 may be integral in relation to the main probing head gripping section 223 of the probing head 222. Integral probing tips 224 are probing tips that are not meant to be removed. They may be fabricated integrally or permanently attached (such that substantial manipulation or breakage is required for removal) to the main probing head gripping section 223.

Various embodiments of the replaceable probing tip could incorporate subject matter of U.S. Pat. No. 6,956,362 (entitled Modular Active Test Probe And Removable Tip Module Therefor), U.S. Pat. No. 6,828,769 (entitled Cartridge System For A Probing Head For An Electrical Test Probe), U.S. Pat. No. 6,605,934 (entitled Cartridge System For A Probing Head For An Electrical Test Probe), and U.S. patent application Ser. No. 10/996,073 (entitled Cartridge System For A Probing Head For An Electrical Test Probe). These references have been assigned to LeCroy Corporation (the assignee of the present invention) and are hereby incorporated by reference. For example, the probing head 222 of the present invention may be implemented as a cartridge system in which the main probing head gripping section 223 is the main probing head body or is replaced by the main probing head body with electronics positioned therein and the probing tip 224 is implemented as a probing tip cartridge with a probing tip (planar probing tip 224). A minimally inductive electrical contact mechanism electrically would couple the electronics to the probing tip when the probing tip cartridge is in mating relationship with the main probing head body.

Positioning

Figure 21:
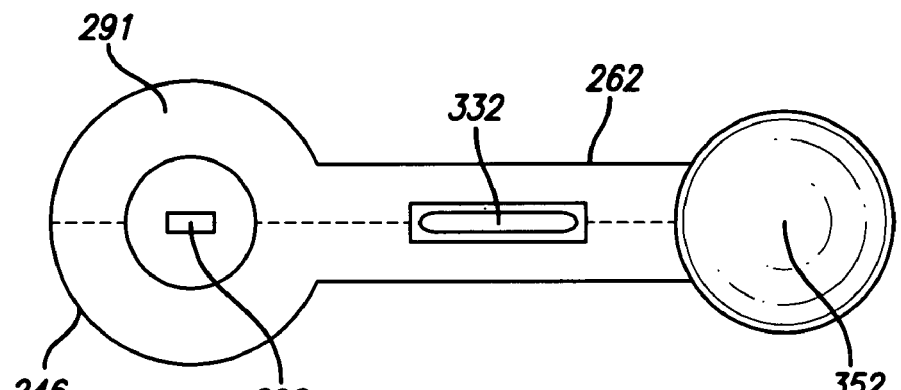
FIG. 21 is a back end view of a planar probing tip implemented with a transmission line structure.

At least part of the probing tip 224 may be "ball-mounted" to a holder 350 (FIG. 16). A ball-mounted embodiment of the present invention would include a ball joint 352 attached to the back end (FIG. 21) of the body 240 remote from the test point connectors 250. The holder 350 includes a socket that encloses the ball joint 352. The ball joint 352 is able to rotate within the socket of the holder 350. The holder 350 may have a means for tightening the socket or otherwise limiting the movement of the ball joint 352 therein. In such an embodiment, the ball joint 352 may rotate freely in the socket of the holder 350 and then, when the movement limiting mechanism is actuated, the ball joint 352 is held in place. Alternatively, the ball joint 352 may rotate with sufficient friction within the socket of the holder 350 so that the body 240 may be easily positioned by a user's fingertips, but then holds its position. The holder 350 may be removably connectable (and replaceable) to the ball joint 352 or permanently connectable to the ball joint 352.

Ball-mounting provides flexibility for the user to position the connectors 250. For example, because of the length of the handle of the holder 350, a user is provided with additional length to reach distant connection mechanisms 234. Because the holder 350 can be relatively thin or narrow, the user is able to probe connection mechanisms 234 in places where his hand might not be able to reach. Also, the body 240 can be set at almost any desired angle in relation to the holder 350 which could not be accomplished if a handle was fixed to the body 240. Still further, the position of the body 240 can be adjusted without moving the remainder of probing head 222 and/or probing tip 224.

Although the holder 350 is shown as being a simple handle-type holder, in alternative embodiments, a holder may incorporate legs, or bendable structure, and/or adhereable structure. The legs may be similar to those described in U.S. Pat. No. 6,462,529 (entitled Legs For Forming A Tripod With An Electrical Test Probe) which issued to LeCroy Corporation (the assignee of the present invention) and is hereby incorporated by reference. The bendable structure and/or adhereable structure may be similar to the structure described in U.S. patent application Ser. No. 11/286,787 (entitled Adherable Holder For Test Probe Tip) which has been assigned to LeCroy Corporation (the assignee of the present invention) and is hereby incorporated by reference.

Geometry

In one preferred embodiment, the probing tip 224 has an extremely small geometry. A probing tip 224 having the flat/planar configuration may allow access to narrow slots not accessible by known differential probing heads.

In one preferred embodiment, this configuration includes a ground plane loop that is made relatively short. This would allow a probing tip 224 having this structure to go to 8 GHz or higher.

In one preferred embodiment, the probing tip 224 is made as a single mechanical piece.

It should be noted that the figures are not drawn to scale. Even among the figures, sizes of various elements may be disproportionate. The size of the various components would be based on considerations including, but not limited to intended use, technical considerations, and manufacturing considerations. For purposes of example only, the following are exemplary measurements: a main probing head gripping section 223 may have a length of approximately 2-4 inches (5-10 centimeters); a probing tip 224 using the transmission line structure (including the test point connectors 250, differential amplifier 340, and elongate common substrate 342) may have a length of approximately 6-8 inches (15-20 centimeters); a body 240 and the test point connector projections 242, 244 together may have a length of approximately 0.5-1.5 inches (1-4 centimeters); a body housing 262 (enclosing body 240) may have a thickness of approximately 0.1-0.2 inches (0.2-0.4 centimeters); a reinforced body flexible substrate 260 (including layers 266*a* and 266*b*) may have a thickness of less than 0.05 inches (0.1 centimeters); and spring-loaded pogo pin test point connectors 250 (in their expanded state) may have a length of approximately 0.1-0.3 inches (0.2-0.8 centimeters).

SPECIFIC EXEMPLARY EMBODIMENTS

The following paragraphs detail several exemplary embodiments. It should be noted that additional embodiments may be made by combining elements of these exemplary embodiments as well as by combining additional elements shown in the drawings and/or discussed elsewhere in this specification.

FIG. 16 shows a preferred exemplary embodiment of a planar probing tip 224*a* with transmission line structure. The planar probing tip 224*a* attaches to a main probing head gripping section 223. The planar probing tip 224*a* of this embodiment is divided such that the body 240 and the test point connectors 250 are separated from the differential amplifier 340 by an elongate common substrate 342. The planar probing tip 224*a* has a substantially planar body 240, a first movable test point connector projection 242, a second stationary test point connector projection 244, a single motion actuator 246, and a single motion translator 248. The motion actuator 246 is shown as being actuated by an external tool 290*a* such as a screwdriver. Each test point connector projection 242, 244 is associated with a single test point connector 250. The motion translator 248 is connected to the movable test point connector projection 242 such that when the motion translator 248 moves, the associated linked movable test point connector projection 242 also moves. The body 240 of this embodiment includes a ball joint 352 for ball-mounting to a holder 350.

FIGS. 17 and 18 show a preferred exemplary embodiment of a planar probing tip 224*b* with an integral actuation mechanism. The probing tip 224*b* includes a differential amplifier 340 (in phantom) that is included in the body 240. As with the planar probing tip 224*a*, the planar probing tip 224*b* has a substantially planar body 240, a first movable test point connector projection 242, a second stationary test point connector projection 244, a single motion actuator 246, and a single motion translator 248. The motion actuator 246 is shown as being actuated by an integral actuation mechanism. The integral actuation mechanism may be a thumb screw 290*b* (FIG. 17) or an elongate thumb screw 290*b*' (FIG. 18). Each test point connector projection 242, 244 is associated with a single test point connector 250. The motion translator 248 is connected to the movable test point connector projection 242 such that when the motion translator 248 moves, the associated linked movable test point connector projection 242 also moves. This embodiment of the planar probing tip 224b does not specifically include a means for holding or mounting. In one preferred embodiment, the body 240 may be elongated such that a user would directly hold the body 240 (effectively incorporating the main probing head gripping section). There may also be specially developed holders, grips, and/or mounters.

FIGS. 19 and 20 show a preferred exemplary embodiment of a planar probing tip 224c with an adjacent replaceable main probing head gripping section 223. As with the previous planar probing tips 224a, 224b, the planar probing tip 224c has a substantially planar body 240, a first movable test point connector projection 242, a second stationary test point connector projection 244, a single motion actuator 246, and a single motion translator 248. Although the motion actuator is shown as being actuatable by an external tool (e.g. the motion actuator 246a of FIG. 30), a motion actuator with an integral actuation mechanism (e.g. the motion actuator 246b of FIG. 31) could also be used. Each test point connector projection 242, 244 is associated with a single test point connector (shown as spring-loaded pogo pin 250a). The motion translator 248 is connected to the movable test point connector projection 242 via a link 252 such that when the motion translator 248 moves, the associated linked movable test point connector projection 242 also moves. This embodiment of the planar probing tip 224c is meant to be associated with a main probing head gripping section 223 (shown in phantom). The main probing head gripping section 223 and planar probing tip 224c would include appropriate structure for physically and electrically connecting the two parts. In one preferred embodiment, the planar probing tip 224c is meant to be removable and replaceable in relation to the main probing head gripping section 223. Appropriate structure may be, for example, the structure set forth in U.S. Pat. No. 6,956,362, U.S. Pat. No. 6,828,769, U.S. Pat. No. 6,605,934, and/or U.S. patent application Ser. No. 10/996,073, which have been incorporated by reference.

FIGS. 24 and 25 show a preferred exemplary embodiment of a planar probing tip 224d with dual movement. The planar probing tip 224c has a substantially planar body 240, a first movable test point connector projection 242, a second movable test point connector projection 244', two motion actuators 246, and two motion translators 248. Each motion translator 248 is connected to an associated movable test point connector projection 242, 244' via a link 252 such that when the motion translators 248 move, the associated linked movable test point connector projections 242, 244' also move. Although the motion actuators are shown as being actuatable by an external tool (e.g. the motion actuator 246a of FIG. 30), motion actuators with an integral actuation mechanism (e.g. the motion actuator 246b of FIG. 31) could also be used. Each test point connector projection 242, 244' is associated with a single test point connector 250. One advantage of having dual movement is that it increases the span between the connectors associated with the movable test point connector projection 242, 244'.

FIG. 32 shows an alternative embodiment of a planar probing tip with dual movement in which a single exemplary motion actuator 246c is attached to a plurality of motion translators 248 that, in turn, are attached to the movable test point connector projections 242, 244'. In this shown embodiment, the upper prongs of a "Y-shaped" connector 316' mate with respective motion translators 248 and the lower prong mates with the motion actuator 246c. So that the first movable test point connector projection 242 moves in a first direction and the second movable test point connector projection 244' moves in a second direction, there must be some control as to the direction that the test point connector projections 242, 244' will move when actuated. This may be accomplished, for example, using unidirectional hinge mechanisms 254 and/or motion limiters 318 (e.g. as shown in FIG. 24) may be used to help direct the appropriate hinging action of the hinge mechanisms 254. This embodiment also shows an alternative embodiment of a link 252' that is implemented by at least partially integrally forming the motion translator 248 and the associated test point connector projection 242, 244'. This exemplary motion actuator 246c is remotely actuatable by remote actuation mechanism 290c.

It should be noted that the term "end" is meant to be relative. For example, in FIG. 30, the first end 310 of the motion translator 248 may be towards the actual end of the motion translator, but not the extreme end.

SECOND APPLICATION OF THE PRESENT INVENTION

As mentioned, the resistive test probe tip described above may be used alone or in conjunction with many types of applications. This second application of the resistive test probe tip of the present invention is one alternative preferred application. The following sections detail this alternative application as a resistive test probe tip 527 of an alternative spring-loaded pogo pin test point connector 450 used in an alternative embodiment of a planar probing tip 424. It should be noted, however, that the alternative spring-loaded pogo pin test point connector 450 may be used with other test probe tips and other test point connectors regardless of whether they are described herein.

To avoid unnecessary repetition, this description of the alternative embodiment of a planar probing tip incorporates by reference structure from the first embodiment of a planar probing tip to provide details not mentioned in this description and/or to be used as alternatives to specific elements discussed in relation to this alternative embodiment. (For example, the alternative embodiment could be implemented with transmission line structure (as shown in FIG. 16) or with dual movement (as shown in FIGS. 24, 25, or 32). Another example is that subsections associated with positioning and geometry, are not repeated here, but are incorporated.) Similarly, the description of the first embodiment of a planar probing tip incorporates by reference structure from this alternative embodiment of a planar probing tip to fill in details not mentioned in the description of the first embodiment and/or as alternatives to specific elements discussed in relation to the first embodiment.

ALTERNATIVE EMBODIMENT OF A PLANAR PROBING TIP

Figure 37:
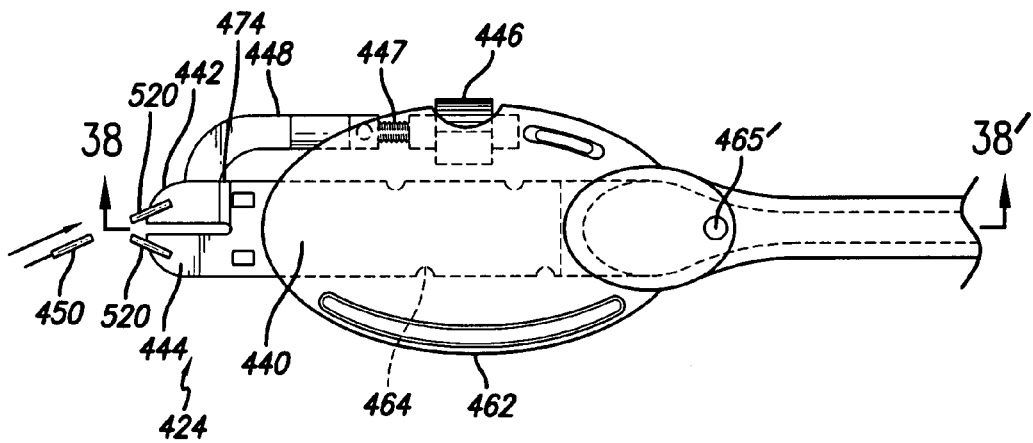
FIG. 37 is a top view of an alternative planar probing tip in which a resistive test probe tip test point connector may be used.
Figure 38:
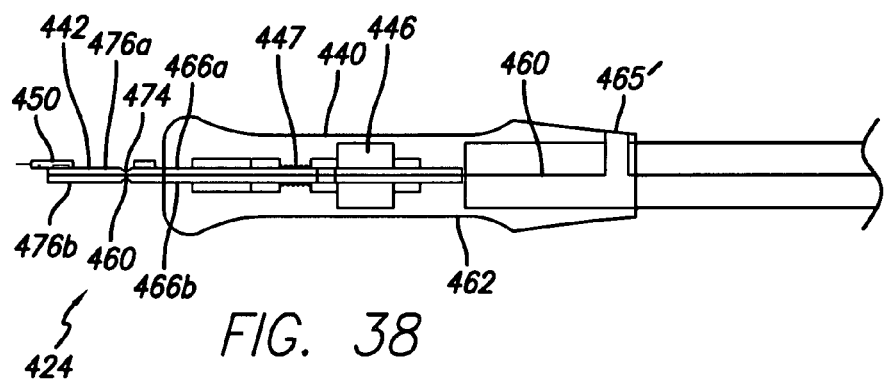
FIG. 38 is a cross-sectional view of the alternative planar probing tip of FIG. 37 taken along line 38-38'.

FIGS. 37 and 38 show an alternative probing tip 424 that could be used instead of probing tip 224. As with previous embodiments, the planar probing tip 424 has a substantially planar body 440, a first test point connector projection 442, a second test point connector projection 444, at least one motion actuator 446, and at least one motion translator 448. Each test point connector projection 442, 444 is designed to hold or be associated with at least one test point connector 450 (e.g. spring-loaded pogo pin test point connector 450 with the resistive test probe tip 527 of FIGS. 40-41). The motion translator 448 is connected or linked to at least one test point connector projection 442, 444 such that when the motion translator 448 moves, the associated linked test point connector projection 442, 444 also moves. In practice, if a probing tip 424 is in a closed position (e.g. the connectors 450 are close together) and a user wants to widen the distance between the connectors 450, the user would actuate the motion actuator 446. Conversely, if a probing tip 424 is in an open position (e.g. the connectors 450 are spaced apart) and a user wants to narrow the distance between the connectors 450, the user would actuate the motion actuator 446. This is described in detail elsewhere in this document.

The body 440 of the planar probing tip 424 includes a flexible substrate 460 (FIG. 39) enclosed within a body housing 462. The body flexible substrate 460 may have notches 464, openings 465 (through which pegs 465' may protrude), projections (not shown), or other means to help prevent the body flexible substrate 460 from shifting, moving, or rotating within the body housing 462. Electronic components (e.g. transmission paths, traces, resistors, and capacitors) may be incorporated into or supported by the body 440. The body housing 462 is shown as having a substantially oval or elliptical planar shape (as in the top view of FIG. 37) and a substantially flattened "hourglass" or "pinched-center" cross-sectional shape (having a relative concave top and a relative concave bottom) as in the side view of FIG. 38. This shape would be aesthetically pleasing, ergonomically comfortable, and functional.

The first test point connector projection 442 includes or supports a portion of the transmission path. The first test point connector projection body end is movably attached to the body flexible substrate 460 of the body 440 and allows motion therebetween. In preferred embodiments, a hinge mechanism 474 (such as flex) between the first test point connector projection body end and the body flexible substrate provides a flexible connection therebetween. The hinge mechanism 474 may be constructed using a body flexible substrate 460 that is coated or otherwise reinforced (shown as layers 466a and 466b) and a first test point connector projection 442 that is similarly coated or otherwise reinforced (shown as layers 476a and 476b). The hinge mechanism 474 is neither coated nor reinforced (so it is not stiff) and, therefore, is bendable. The second test point connector projection 444 may be fixed (e.g. relatively stiff) or movable (e.g. including a hinge mechanism). Both the first test point connector projection 442 and the second test point connector projection 444 may have sockets 520 (or specially designed connectors) for accommodating a resistive test probe tip 527.

The motion actuator 446 actuates motion between the first test point connector projection 442 and the second test point connector projection 444. In one preferred embodiment, the motion actuator 446 actuates motion in a first linear direction (e.g. forward and backward along an x axis) that the motion translator 448 translates or converts into motion of at least one of the test point connector projections 442 in a second linear direction (e.g. up and down along a z axis). The motion actuator 446 shown in FIGS. 37 and 38 is a ridged knob, at least part of which protrudes from the body housing 462 (e.g. from the body housing side as shown in FIG. 37, from the body housing top, and/or from the body housing bottom) so that a user can rotate the knob to actuate motion. Rotating the knob of the motion actuator 446 in one direction causes the screw 447 to advance forward. Rotating the knob of the motion actuator 446 in the other direction causes the screw 447 to retreat backward. The forward advancement and backward retreat cause the motion translator 448 to flex/bend, straighten, or otherwise translate the movement. It should be noted that other motion actuators, including those shown in FIGS. 30-32, could be used as motion actuator 446.

Figure 39:
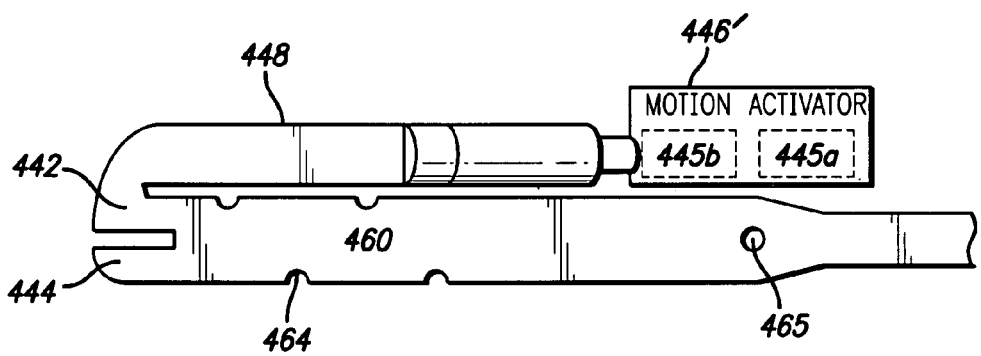
FIG. 39 is a plan view of an exemplary flexible substrate with a generic motion actuator.

FIG. 39 shows an alternative preferred motion actuator 446' that is automated. This automated motion actuator 446' would be actuatable from the probing tip 424 itself or remotely (using a transmitter/receiver system). The physical embodiment of the motion actuator 446' would include both an activating mechanism 445a (e.g. switch(es), button(s), knob(s), dial(s), lever(s), joy stick(s), digital actuator(s) (e.g. computerized or keyboarded)) and an implementing mechanism 445b (e.g. a motor). A user would use the activating mechanism 445a to control the implementing mechanism 445b of the automated motion actuator 446'. In one preferred embodiment the user would activate (e.g. flip a switch to its "on" position) the activating mechanism 445a until the test point connector projections 442, 444 are a desired distance from each other and then de-activate (e.g. return the switch to its "off" position) the activating mechanism 445a. In another preferred embodiment the user would activate the activating mechanism 445a so that the test point connector projections 442, 444 move to a pre-determined distance from each other. In this situation the user would activate (e.g. depress a button) the activating mechanism 445a and the test point connector projections 442, 444 would spread or narrow to a pre-determined distance without further user interaction. The pre-determined distance(s) may be factory set or programmed by the user. Alternative embodiments would allow the user to use a numeric keyboard to set the desired distance or would have multiple types of activating mechanisms. The implementing mechanism 445b may be any type of motor having the appropriate size and power requirements. Exemplary motors include those produced by New Scale Technologies, Inc. (of Victor, N.Y.) such as SQL-1.5-6-12 as well as those described in U.S. Pat. Nos. 6,940,209 and 7,170,214, the disclosures of which are incorporated herein by reference. Alternatively, a custom version of the NM 70 linear actuators produced by Nano-Muscle, Inc. (Antioch, Calif.) may be used.

Motion translators, connectors, links, optional motion limiters, and other components may used as necessary to convert the motion actuator torque or other force into linear force for moving a test point connector projection as discussed above and incorporated herein by reference.

ALTERNATIVE EMBODIMENT OF A SPRING-LOADED POGO PIN TEST POINT CONNECTOR WITH A RESISTIVE TEST PROBE TIP

FIGS. 40-42 show an alternative embodiment of a spring-loaded pogo pin test point connector 450 with a resistive test probe tip 527. The shown spring-loaded pogo pin test point connector 450 can be used with the first embodiment of the planar probing tip 224, the alternative embodiment of the planar probing tip 424, or with other probing tips. In the shown embodiment of FIGS. 37-38, both the first test point connector projection 442 and the second test point connector projection 444 have sockets 520 (or specially designed connectors) for accommodating a resistive test probe tip 527.

FIG. 40 shows the individual components of the alternative spring-loaded pogo pin test point connector 450 substantially separated. Specifically, the components include a sleeve 521 (also referred to as a barrel), a plunger 523 (also referred to as a shaft), a spring 524, and a resistive test probe tip 527. The plunger 523 has a back spring section 523a and a front tip section 523b that are separated by a divider section 523c. The plunger's back spring section 523a contacts the spring 524 and compresses it against the end of the sleeve 521. The plunger's front tip section 523b creates a shoulder 523b' and also has a test point connector receptacle 526 (and an optional conductive adhesive overflow receptacle 526') defined therein.

FIG. 41 shows the alternative spring-loaded pogo pin test point connector 450 with the resistive test probe tip 527 positioned in the plunger's test point connector receptacle 526, and the plunger 523 is positioned in the sleeve 521. The pogo pin test point connector 450 is shown in this figure in an expanded/extended state. The resistive test probe tip 527 may be secured in the plunger's test point connector receptacle 526 using an optional conductive adhesive at this stage.

FIG. 42 shows the alternative spring-loaded pogo pin test point connector 450 with the resistive test probe tip 527 secured in the plunger's test point connector receptacle 526, and the plunger 523 is secured in the sleeve 521. The pogo pin test point connector 450 is shown in this figure in a contracted state such that the shoulder 523b' of the plunger's front tip section 523b contact the opening end (rim 525) of the sleeve 521. The resistive test probe tip 527, as shown in this figure, is preferably secured in the plunger's test point connector receptacle 526 by crimping or indenting (e.g. 529a, 529a') the plunger's front tip section 523b. The plunger 523 is shown as being secured in the sleeve 521 by crimping or indenting 529b.

For purposes of enablement and best mode, it should be noted that techniques described in patents (e.g. U.S. Pat. No. 6,652,326) and published applications (e.g. U.S. Patent Application Publication No. US 2005-0280433 A1) owned by Rika Denshi America, Inc., Rika Electronics International, Inc., and related companies are specifically incorporated herein by reference.

The spring 524 provides an outward force tending to push the spring-loaded pogo pin test point connector 450 into an expanded/extended position (FIG. 41). Putting sufficient force on the test point connector 527 overcomes the spring's force such that the spring 524 compacts and the plunger 523 slides into the sleeve 521 (FIG. 42). In one preferred embodiment, the plunger 523 only slides into the sleeve 521 until the shoulder 523b' of the plunger's front tip section 523b comes in contact with the annular rim 525 of the sleeve 521 and creates a "short circuit."

In the shown preferred embodiment, the spring-loaded pogo pin test point connector 450a uses a resistive test probe tip 527. It should be noted that the front section (the surface used for making contact) of the resistive test probe tip 527 may have a light gold dusting. The optional gold dusting may enhance the electrical connection during probing.

It should be noted that the many of the terms used herein are relative and are not meant to limit the scope of the invention. For example, "top" and "bottom" are relative terms and, if the orientation were reversed, could be reversed. Similarly, "forward" and "backward" are relative terms and, if the orientation were reversed, could be reversed. These are meant to be examples and other relative terms used in the specification are meant to be construed as such.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A test probe tip or contact comprising:
   (a) resistive material having a resistance described by the equation $R_1 = 0.75 \times (\sqrt{L_1/(C_1 \times Length)})$ where $R_1$ is the resistance, $L_1$ is the inductance, and $C_1$ is the capacitance per millimeter;
   (b) said test probe tip or contact constructed substantially from said resistive material, said test probe tip comprising:
      (i) a probing end for probing electronic circuitry; and
      (ii) a connection end for interfacing with a probing head; and
   (c) said resistive material forming at least one electrical path from said probing end to said connection end.

2. The test probe tip or contact of claim 1 wherein said resistive material is nonmetallic.

3. The test probe tip or contact of claim 1 wherein said resistive material is pultruded resistive material.

4. The test probe tip or contact of claim 1 wherein said resistive material is pultruded rod.

5. The test probe tip or contact of claim 1 wherein said test probe tip or contact is a molded test probe tip or contact.

6. The test probe tip or contact of claim 1 wherein said test probe tip is constructed entirely of said resistive material.

7. The test probe tip or contact of claim 1, said resistive material having a longitudinal axis, said resistive material comprising:
   (a) a plurality of longitudinally-extending resistive/conductive members, at least one resistive/conductive member having a first resistive/conductive member end and a second resistive/conductive member end;
   (b) encapsulating material enclosing said plurality of longitudinally-extending resistive/conductive member; and
   (c) said first resistive/conductive member end and said second resistive/conductive member end exposed from said encapsulating material to provide electrical contacts.

8. The test probe tip or contact of claim 7 wherein said encapsulating material is nonconductive encapsulating material.

9. The test probe tip or contact of claim 7 wherein said plurality of longitudinally-extending resistive/conductive members are conductive fiber elements.

10. The test probe tip or contact of claim 7 wherein said plurality of longitudinally-extending resistive/conductive members is a plurality of nonmetallic longitudinally-extending resistive/conductive members.

11. The test probe tip or contact of claim 1 wherein said resistive conducting material includes a plurality of conductive fiber elements.

12. The test probe tip or contact of claim 11 wherein said plurality of conductive fiber elements is a plurality of nonmetallic conductive fiber elements.

13. The test probe tip or contact of claim 1 wherein said resistive conducting material includes a plurality of conductive fiber elements, wherein said plurality of conductive fiber elements is made from a material selected from the group consisting of:
   (a) carbon;
   (b) carbon/graphite;
   (c) nichrome; and
   (d) graphite.

14. The test probe tip or contact of claim 1 wherein said resistive conducting material includes, wherein said encapsulating material is made from a material selected from the group consisting of:
(a) a polymer;
(b) structural thermoplastic;
(c) thermosetting resins;
(d) polyesters;
(e) epoxies;
(f) vinyl esters;
(g) polyetheretherketones;
(h) polyetherimides;
(i) polyethersulphones;
(j) polypropylene;
(k) nylon;
(l) an elastomeric matrix;
(m) a silicone;
(n) fluorosilicone; and
(o) polyurethane elastomer.

15. The test probe tip or contact of claim 1, wherein said resistive material includes a plurality of longitudinally-extending resistive/conductive members.

16. The test probe tip or contact of claim 15 wherein said plurality of longitudinally-extending resistive/conductive members is a plurality of nonmetallic longitudinally-extending resistive/conductive members.

17. The test probe tip or contact of claim 1, wherein said resistive material includes a plurality of particulate resistive/conductive members.

18. The test probe tip or contact of claim 17 wherein said plurality of particulate resistive/conductive members is a plurality of nonmetallic particulate resistive/conductive members.

* * * * *